United States Patent
Eckberg et al.

(10) Patent No.: US 8,919,143 B2
(45) Date of Patent: Dec. 30, 2014

(54) AIR-COOLING WALL WITH SLIDABLE HEAT EXCHANGERS

(75) Inventors: Eric A. Eckberg, Rochester, MN (US); David P. Graybill, Staatsburg, NY (US); Madhusudan K. Iyengar, Woodstock, NY (US); Howard V. Mahaney, Jr., Cedar Park, TX (US); Roger R. Schmidt, Poughkeepsie, NY (US); Kenneth R. Schneebeli, Tucson, AZ (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 110 days.

(21) Appl. No.: 13/115,390

(22) Filed: May 25, 2011

(65) Prior Publication Data
US 2012/0298335 A1   Nov. 29, 2012

(51) Int. Cl.
*F28D 11/00* (2006.01)
*F25D 23/12* (2006.01)
*H05K 7/20* (2006.01)

(52) U.S. Cl.
CPC .................. *H05K 7/2079* (2013.01)
USPC .............. 62/259.2; 62/263; 165/86

(58) Field of Classification Search
CPC .......... H05K 7/20218; H05K 7/20709; H05K 7/2079; H05K 7/20781; G06F 1/20; F24F 1/04; F25D 16/00; F25D 17/04; F28D 11/00
USPC ............ 62/259.2, 263, 382, 434; 165/104.33, 165/86, 78, 96, 103; 160/43; 361/701
See application file for complete search history.

(56) References Cited

U.S. PATENT DOCUMENTS

| | | |
|---|---|---|
| 3,317,798 A | 5/1967 | Chu et al. |
| 4,108,240 A | 8/1978 | Margen et al. |

(Continued)

FOREIGN PATENT DOCUMENTS

| | | | |
|---|---|---|---|
| GB | 2436669 B | 5/2011 | |
| JP | 2010-079619 | * 3/2010 | ................ G06F 1/20 |

(Continued)

OTHER PUBLICATIONS

Ellsworth, Jr. et al., "The Evolution of Water Cooling for IBM Larger Server Systems: Back to the Future", IEEE, Piscataway, NJ, 2008 11th Intersociety Conference on Thermal and Thermomechanical Phenomena in Electronic Systems (ITHERM '08), pp. 266-274 (May 2008).

(Continued)

*Primary Examiner* — Mohammad M Ali
*Assistant Examiner* — Christopher R Zerphey

(57) ABSTRACT

An air-cooling apparatus is provided which includes an air-cooling wall cooling airflow passing through an electronics rack(s) of a data center. The air-cooling wall is disposed separate from and in spaced relation to the air inlet or air outlet side(s) of the electronics rack(s), and includes a wall panel support structure disposed separate from the electronics rack(s), which supports one or more slidable wall panels. The slidable wall panel(s) includes an air-to-liquid heat exchanger slidably supported and disposed in spaced relation to the air outlet or air inlet side of the electronics rack(s). The heat exchanger extracts heat from air passing across the heat exchanger and is slidable within the support structure in a direction transverse to the direction of airflow through the rack(s). Slidable support of the heat exchanger by the support structure facilitates access to the air outlet or air inlet sides of the electronics rack(s).

20 Claims, 17 Drawing Sheets

(56) References Cited

U.S. PATENT DOCUMENTS

| | | | |
|---|---|---|---|
| 5,150,277 A | 9/1992 | Bainbridge et al. | |
| 5,181,392 A * | 1/1993 | Itoh et al. | 62/160 |
| 5,228,197 A | 7/1993 | Cox et al. | |
| 5,467,250 A | 11/1995 | Howard et al. | |
| 5,467,609 A | 11/1995 | Feeney | |
| 6,012,220 A | 1/2000 | Cornejo | |
| 6,164,369 A | 12/2000 | Stoller | |
| 6,305,180 B1 * | 10/2001 | Miller et al. | 62/259.2 |
| 6,704,198 B2 | 3/2004 | Replogle et al. | |
| 6,775,137 B2 | 8/2004 | Chu et al. | |
| 6,819,563 B1 | 11/2004 | Chu et al. | |
| 6,924,981 B2 | 8/2005 | Chu et al. | |
| 7,283,358 B2 | 10/2007 | Campbell et al. | |
| 7,286,351 B2 | 10/2007 | Campbell et al. | |
| 7,312,993 B2 | 12/2007 | Bundza et al. | |
| 7,342,789 B2 | 3/2008 | Hall et al. | |
| 7,385,810 B2 | 6/2008 | Chu et al. | |
| 7,397,661 B2 | 7/2008 | Campbell et al. | |
| 7,477,514 B2 | 1/2009 | Campbell et al. | |
| 7,630,795 B2 | 12/2009 | Campbell et al. | |
| 7,639,486 B2 | 12/2009 | Champion et al. | |
| 7,660,109 B2 | 2/2010 | Iyengar et al. | |
| 7,660,116 B2 | 2/2010 | Claassen et al. | |
| 7,660,117 B2 | 2/2010 | Werner et al. | |
| 7,660,121 B2 | 2/2010 | Campbell et al. | |
| 7,757,506 B2 | 7/2010 | Ellsworth, Jr. et al. | |
| 7,832,925 B2 | 11/2010 | Archibald et al. | |
| 7,963,118 B2 | 6/2011 | Porter et al. | |
| 8,250,877 B2 | 8/2012 | Correa et al. | |
| 2005/0237714 A1 | 10/2005 | Ebermann | |
| 2006/0037736 A1 | 2/2006 | Heyman | |
| 2006/0065000 A1 | 3/2006 | Belady | |
| 2007/0117502 A1 | 5/2007 | Kim | |
| 2008/0018212 A1 | 1/2008 | Spearing et al. | |
| 2008/0060790 A1 * | 3/2008 | Yates et al. | 165/80.3 |
| 2008/0123288 A1 | 5/2008 | Hillis | |
| 2008/0148746 A1 | 6/2008 | Yanik et al. | |
| 2008/0198549 A1 | 8/2008 | Rasmussen et al. | |
| 2008/0232064 A1 * | 9/2008 | Sato et al. | 361/687 |
| 2009/0046423 A1 * | 2/2009 | Hom et al. | 361/694 |
| 2009/0046430 A1 | 2/2009 | Brewer et al. | |
| 2009/0080173 A1 | 3/2009 | Porter et al. | |
| 2009/0086432 A1 | 4/2009 | Campbell et al. | |
| 2009/0122483 A1 | 5/2009 | Hall | |
| 2009/0126909 A1 | 5/2009 | Ellsworth, Jr. et al. | |
| 2009/0207567 A1 | 8/2009 | Campbell et al. | |
| 2009/0225514 A1 | 9/2009 | Correa et al. | |
| 2009/0241578 A1 * | 10/2009 | Carlson et al. | 62/259.2 |
| 2009/0259343 A1 * | 10/2009 | Rasmussen et al. | 700/282 |
| 2009/0260384 A1 | 10/2009 | Champion et al. | |
| 2009/0262501 A1 | 10/2009 | Claassen et al. | |
| 2010/0027216 A1 * | 2/2010 | Matsushima et al. | 361/679.49 |
| 2010/0053879 A1 | 3/2010 | Miyamoto et al. | |
| 2011/0051372 A1 | 3/2011 | Barringer et al. | |
| 2011/0297351 A1 | 12/2011 | Vosper et al. | |
| 2012/0300398 A1 | 11/2012 | Eckberg et al. | |
| 2013/0019627 A1 * | 1/2013 | Yoshikawa et al. | 62/259.2 |

FOREIGN PATENT DOCUMENTS

| | | | |
|---|---|---|---|
| WO | WO 97/47167 A1 | 12/1997 | |
| WO | WO 02/37918 A1 | 5/2002 | |
| WO | WO2010/112873 | * 10/2010 | H05K 7/20 |

OTHER PUBLICATIONS

Eckberg et al., Office Action for U.S. Appl. No. 13/115,404, filed May 25, 2011 (U.S. Patent Publication No. 2012/0300398 A1), dated Jun. 25, 2013 (20 pages).

Eckberg et al., Final Office Action for U.S. Appl. No. 13/115,404, filed May 25, 2011 (U.S. Patent Publication No. 2012/0300398 A1), dated Nov. 8, 2013 (11 pages).

Eckberg et al., Notice of Allowance for U.S. Appl. No. 13/115,404, filed May 25, 2011 (U.S. Patent Publication No. 2012/0300398 A1), dated Mar. 27, 2014 (11 pages).

* cited by examiner

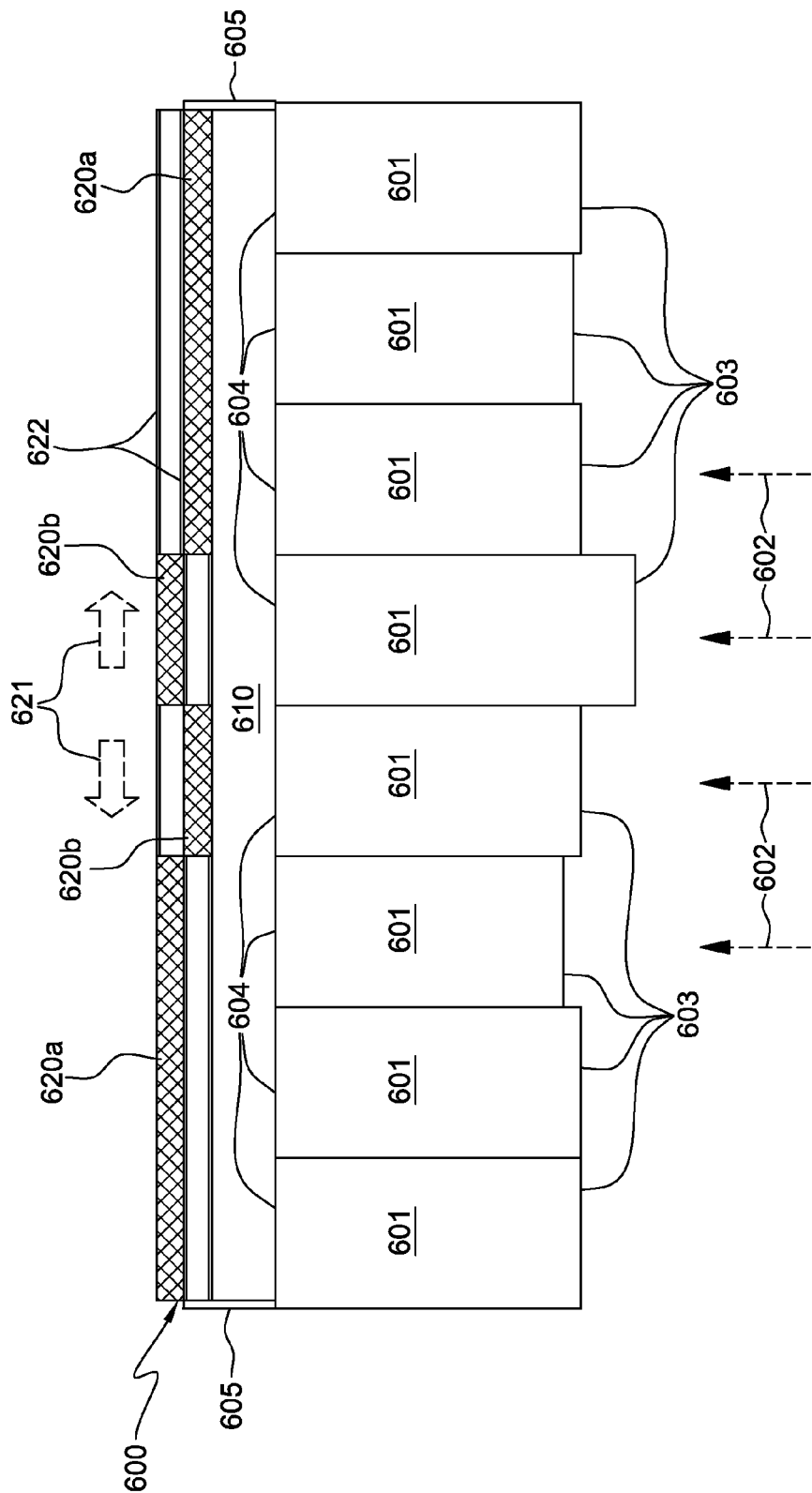

AIR-COOLING WALL WITH SLIDABLE HEAT EXCHANGERS

BACKGROUND

The power dissipation of integrated circuit chips, and the modules containing the chips, continues to increase in order to achieve increases in processor performance. This trend poses a cooling challenge at both module and system levels. Increased airflow rates are needed to effectively cool high-powered modules, and to limit the temperature of the air that is exhausted into the computer center.

In many large server applications, processors, along with their associated electronics (e.g., memory, disk drives, power supplies, etc.), are packaged in removable drawer configurations stacked within a rack or frame. In other cases, the electronics may be in fixed locations within the rack or frame. Typically, the components are cooled by air moving in parallel airflow paths, usually front-to-back, impelled by one or more air-moving devices (e.g., fans or blowers). In some cases, it may be possible to handle increased power dissipation within a single drawer by providing greater airflow, through the use of a more powerful air-moving device, or by increasing the rotational speed (i.e., RPMs) of an existing air-moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms", or large banks of computer racks close together. In such installations, liquid-cooling (e.g., water-cooling) is an attractive technology to manage the higher heat fluxes. The liquid absorbs the heat dissipated by the components/modules in an efficient manner. Typically, the heat is ultimately transferred from the liquid to an outside environment, whether to air or other liquid.

BRIEF SUMMARY

The shortcomings of the prior art are overcome and additional advantages are provided through the provision of an air-cooling apparatus for facilitating cooling of airflow passing through at least one electronics rack. The air-cooling apparatus includes an air-cooling wall which facilitates cooling of airflow passing through the at least one electronics rack, wherein the at least one electronics rack includes an air inlet side and an air outlet side, the air inlet and air outlet sides respectively enabling ingress and egress of air through the at least one electronics rack. The air-cooling wall is air-permeable, and facilitates cooling of airflow passing through the at least one electronics rack. The air-cooling wall is disposed separate from the at least one electronics rack and in spaced relation to one of the air outlet side or the air inlet side of the at least one electronics rack. The air-cooling wall includes a wall panel support structure disposed separate from the at least one electronics rack. The wall panel support structure supports at least one slidable wall panel. The at least one slidable wall panel includes at least one air-to-liquid heat exchanger slidably supported by the wall panel support structure and disposed in spaced relation to the one of the air outlet side or the air inlet side of the at least one electronics rack to facilitate airflow passing through the at least one electronics rack also passing across the at least one air-to-liquid heat exchanger. The at least one air-to-liquid heat exchanger extracts heat from air passing thereacross.

In another aspect, a data center is provided which includes a plurality of electronics racks disposed in a row, and an air-cooling apparatus which facilitates cooling of airflow passing through the plurality of electronics racks. The plurality of electronics racks include air inlet sides and air outlet sides, which respectively enable ingress and egress of airflow through the plurality of electronics racks. The air-cooling apparatus includes an air-cooling wall configured and positioned to cool airflow passing through the plurality of electronics racks. The air-cooling wall is disposed separate from and in spaced relation to one of the air outlet sides or the air inlet sides of the plurality of electronics racks, and includes a wall panel support structure disposed separate from the plurality of electronics racks. The wall panel support structure supports at least one slidable wall panel. The at least one slidable wall panel includes at least one air-to-liquid heat exchanger slidably supported by the wall panel support structure and disposed in spaced relation to the one of the air outlet sides or the air inlet sides of the plurality of electronics racks to facilitate airflow passing through the plurality of electronics racks also passing across the at least one air-to-liquid heat exchanger. The at least one air-to-liquid heat exchanger extracts heat from air passing thereacross.

In a further aspect, a method is provided which comprises: providing an air-cooling wall which facilitates cooling of airflow passing through at least one electronics rack of a data center, the at least one electronics rack comprising an air inlet side and an air outlet side, the air inlet and air outlet sides respectively enabling ingress and egress of air through the at least one electronics rack, and the air-cooling wall being air-permeable and facilitating cooling of the airflow passing through the at least one electronics rack, the air-cooling wall being disposed separate from the at least one electronics racks and in spaced relation to one of the air outlet side or the air inlet side of the at least one electronics rack, wherein the air-cooling wall comprises: a wall panel support structure disposed separate from the at least one electronics rack, the wall panel support structure supporting at least one slidable wall panel; and the at least one slidable wall panel comprising at least one air-to-liquid heat exchanger slidably supported by the wall panel support structure and disposed in spaced relation to the one of the air outlet side or the air inlet side of the at least one electronics rack to facilitate airflow passing through the at least one electronics rack also passing across the at least one air-to-liquid heat exchanger, the at least one air-to-liquid heat exchanger extracting heat from the air passing thereacross.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 6C depicts another embodiment of a data center layout comprising a row of electronics racks and an alternate embodiment of an air-cooling apparatus comprising an air-cooling wall disposed in spaced, opposing relation to one of the air outlet sides or the air inlet sides (with a reversed direction of airflow) of the electronics racks, in accordance with one or more aspects of the present invention;

DETAILED DESCRIPTION

Figure 1A:
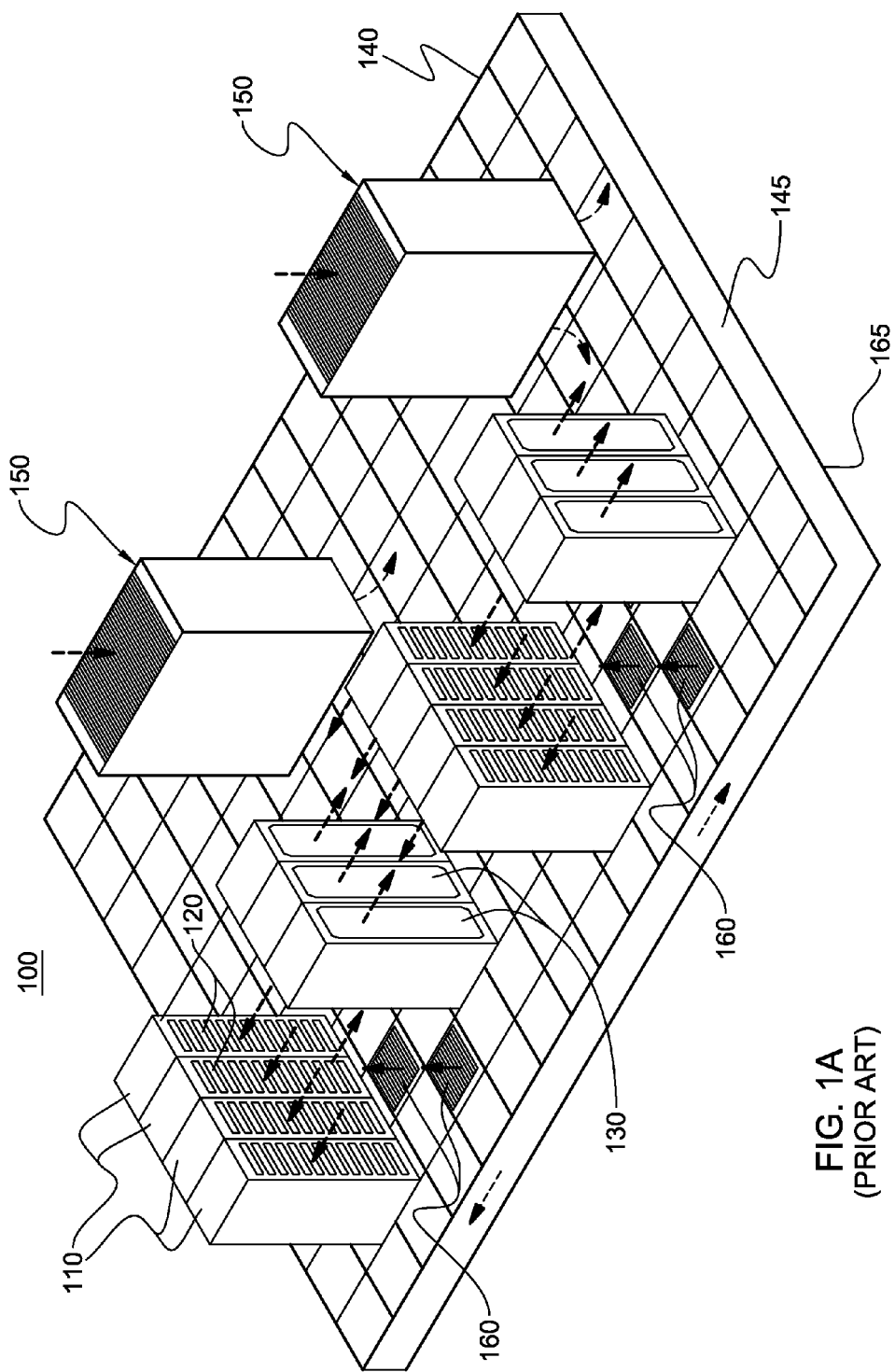
FIG. 1A depicts one embodiment of a conventional, raised floor layout of an air-cooled data center, wherein a supply air plenum distributes cooled airflow to the electronics racks.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with the rack-mounted electronic drawers of a multi-drawer rack unit and blades of a blade center system being two examples of systems (or sub-systems) of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubings (such as copper or other tubing) in thermal or mechanical contact with a plurality of air-cooled cooling fins. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubings (such as copper or other tubing) in thermal or mechanical contact with each other to facilitate conduction of heat therebetween. Size, configuration and construction of the liquid-to-liquid heat exchanger can vary without departing from the scope of the invention disclosed herein. Further, as used herein, "data center" refers to a computer installation containing one or more electronics racks to be cooled. As a specific example, a data center may include one or more rows of rack-mounted computing units, such as server units.

One example of liquid coolant, for example, facility coolant or system coolant, is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

FIG. 1A illustrates a raised floor layout of an air cooled computer installation or data center 100 typical in the prior art, wherein multiple electronics racks 110 are disposed in one or more rows. A computer installation such as depicted in FIG. 1A may house several hundred, or even several thousand microprocessors. In the arrangement of FIG. 1A, chilled air enters the computer room via floor vents from a supply air plenum 145 defined between a raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet airflow to cool the electronic components within the rack. Supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more air-conditioning units 150, also disposed within data center 100. Room air is taken into each air-conditioning unit 150 near an upper portion thereof. This room air comprises in part exhausted air from the "hot" air aisles of the data center defined by opposing air outlet sides 130 of the electronics racks 110.

Figure 1B:
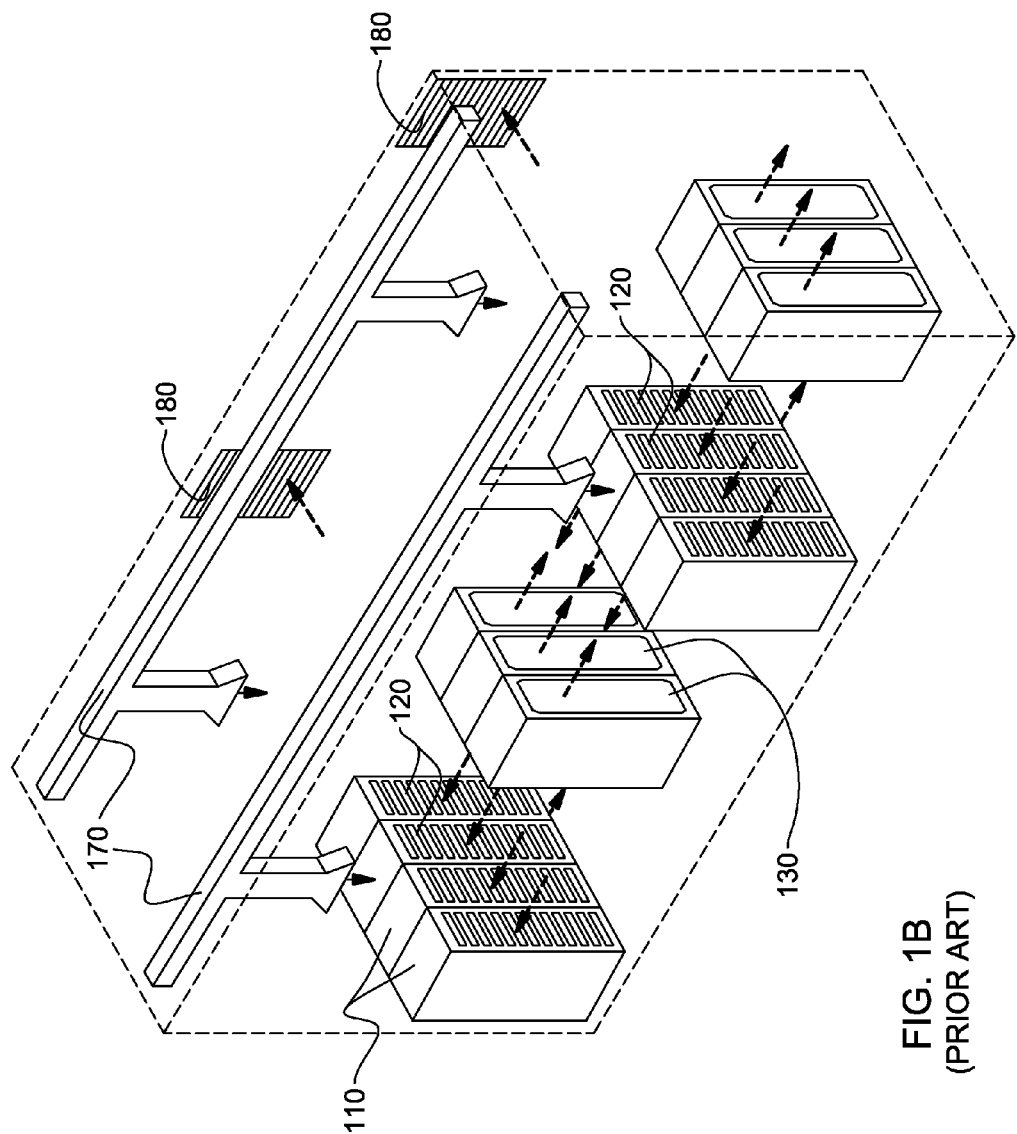
FIG. 1B depicts one embodiment of a conventional, non-raised floor layout of an air-cooled data center, wherein overhead air ducts and diffusers distribute cooled airflow to the electronics racks.

FIG. 1B depicts an alternate data center configuration wherein multiple electronics racks 110 disposed in rows are cooled via conditioned and cooled air entering the room from overhead ducts and diffusers 170. Air exits the room via vents 180 that may be placed at different locations within the room. The ducts and diffusers 170 are disposed to align to the cold aisles of the multiple rows and provide cooled air to the air inlet sides 120 of the electronics racks. Air-moving devices within the racks move the cooled air through the racks from inlet side to outlet side to cool the heat generating components therein. Heated air is exhausted at the hot aisles of the racks through the air outlet sides 130 of electronics racks 110. In one embodiment, returns 180 can be aligned to the hot aisles defined by opposing air exhaust sides 130 of electronics racks in different rows of electronics racks. Note that in another alternate data center configuration, one or more air-conditioning units may be disposed within the data center in combination with overhead ducts and diffusers, such as illustrated in FIG. 1B.

Figure 2:
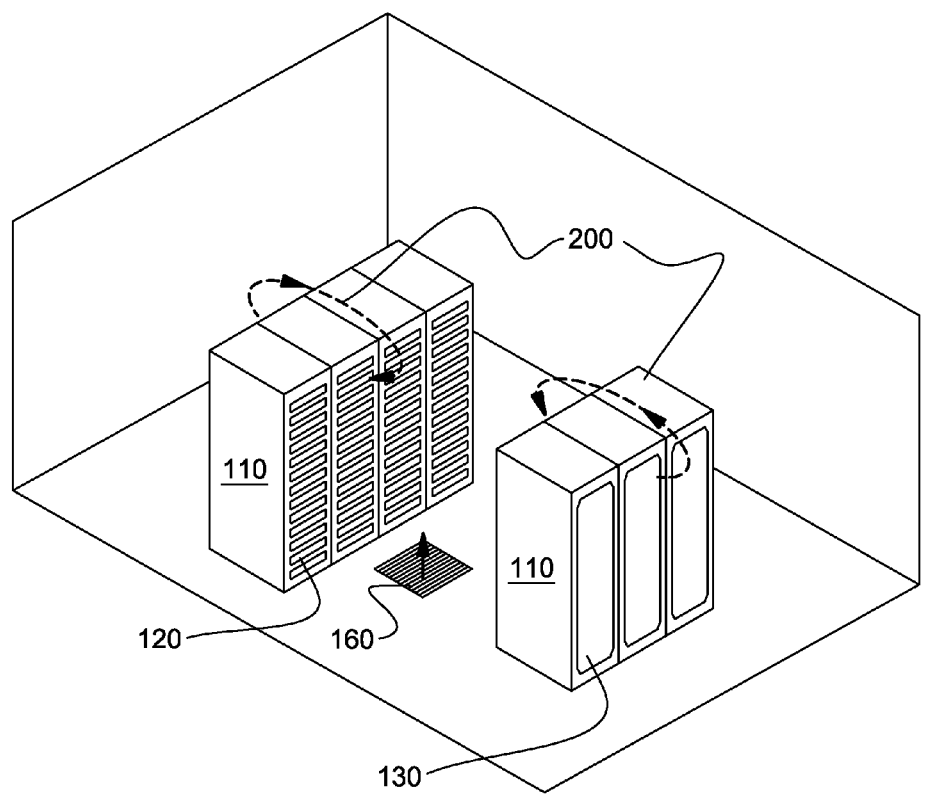
FIG. 2 depicts one problem addressed by the present invention, showing recirculation airflow patterns in one implementation of a raised floor layout of an air-cooled data center.

Due to the ever increasing airflow requirements through electronics racks, and limits of air distribution within the typical data center installation, re-circulation problems within the room may occur. This is shown in FIG. 2 for a raised floor layout, wherein hot air re-circulation 200 is shown occurring from the air outlet side 130 of an electronics rack 110 back to the air inlet side 120 of the electronics rack. This re-circulation can occur because the conditioned air supplied through tiles 160 may only be a fraction of the airflow rate forced through the electronics rack by the air-moving device(s) disposed within the rack. This can be due, for example, to limitations on the tile sizes (or diffuser flow rates). The remaining fraction of the supply of inlet side air may be made up by ambient room air through, for example, re-circulation 200. This recirculating flow is often very complex in nature, and can lead to significantly higher rack unit inlet temperatures than desired.

The re-circulation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 15-32° C. range. For a raised floor layout such as depicted in FIG. 1A, however, temperatures can range from 15-20° C. at the lower portion of the rack, close to the cooled air floor vents, to as much as 32-42° C. at the upper portion of the electronics rack, where the hot air can form a self-sustaining re-circulation loop. Since the allowable rack heat load is limited by the rack inlet air temperature at the "hot" part, this temperature distribution correlates to an inefficient utilization of available air-conditioning capability. Computer installation equipment almost always represents a high capital investment to the customer. Thus, it is of significant importance, from a product reliability and performance view point, and from a customer satisfaction and business perspective, to limit the temperature of the inlet air to the rack unit to be substantially uniform. The efficient cooling of such computer and electronic systems, and the amelioration of localized hot air inlet temperatures to one or more rack units due to re-circulation of air currents, are addressed by the air-cooling apparatuses and methods disclosed herein.

Figure 3:
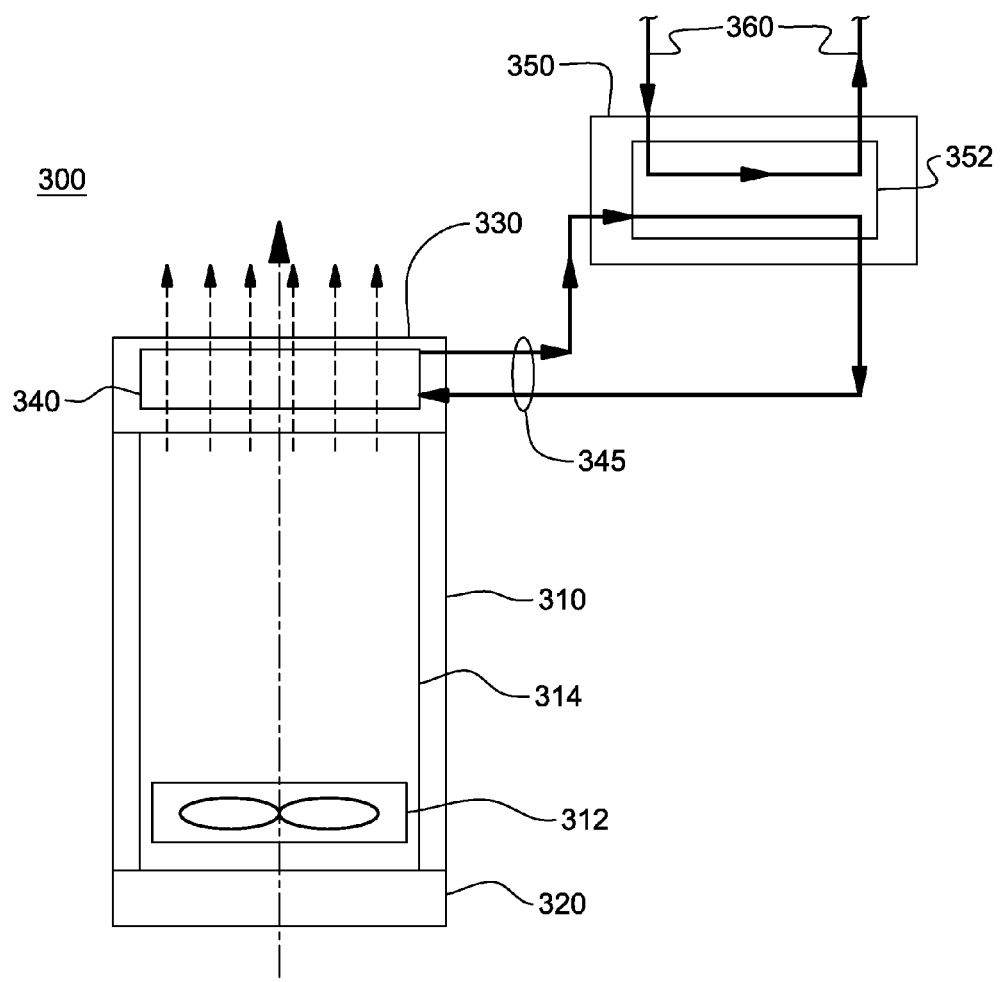
FIG. 3 is a top plan view of one embodiment of an electronics rack with an air-to-liquid heat exchanger mounted to an outlet door thereof, and showing extracted heat being rejected to facility coolant via a coolant distribution unit.

FIG. 3 depicts one embodiment of a cooled electronic system, generally denoted 300. In this embodiment, electronic system 300 includes an electronics rack 310 having an inlet door 320 and an outlet door 330, which have openings to allow for the ingress and egress of external air, respectively, through the air inlet side and air outlet side of electronics rack 310. The system further includes at least one air-moving device 312 for moving external air across at least one electronic system or component 314 positioned within the electronics rack. Disposed within outlet door 330 is an air-to-liquid heat exchanger 340 across which the inlet-to-outlet airflow through the electronics rack passes. A coolant distribution unit 350 is used to buffer the air-to-liquid heat exchanger from facility coolant in a facility coolant loop. Air-to-liquid heat exchanger 340 removes heat from the exhausted inlet-to-outlet airflow through the electronics rack via circulating system coolant, for rejection in coolant distribution unit 350 to facility coolant in a facility coolant loop 360, that is, via a liquid-to-liquid heat exchanger 352 disposed therein. This cooling apparatus advantageously reduces heat load on existing air-conditioning units within the data center, and facilitates cooling of electronics racks by cooling the air egressing from the electronics racks and thus cooling any air recirculating to the air inlet sides thereof.

As shown in FIG. 3, a system coolant loop 345 couples air-to-liquid heat exchanger 340 to coolant distribution unit 350. In one embodiment, the system coolant employed is water. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack".

Figure 4:
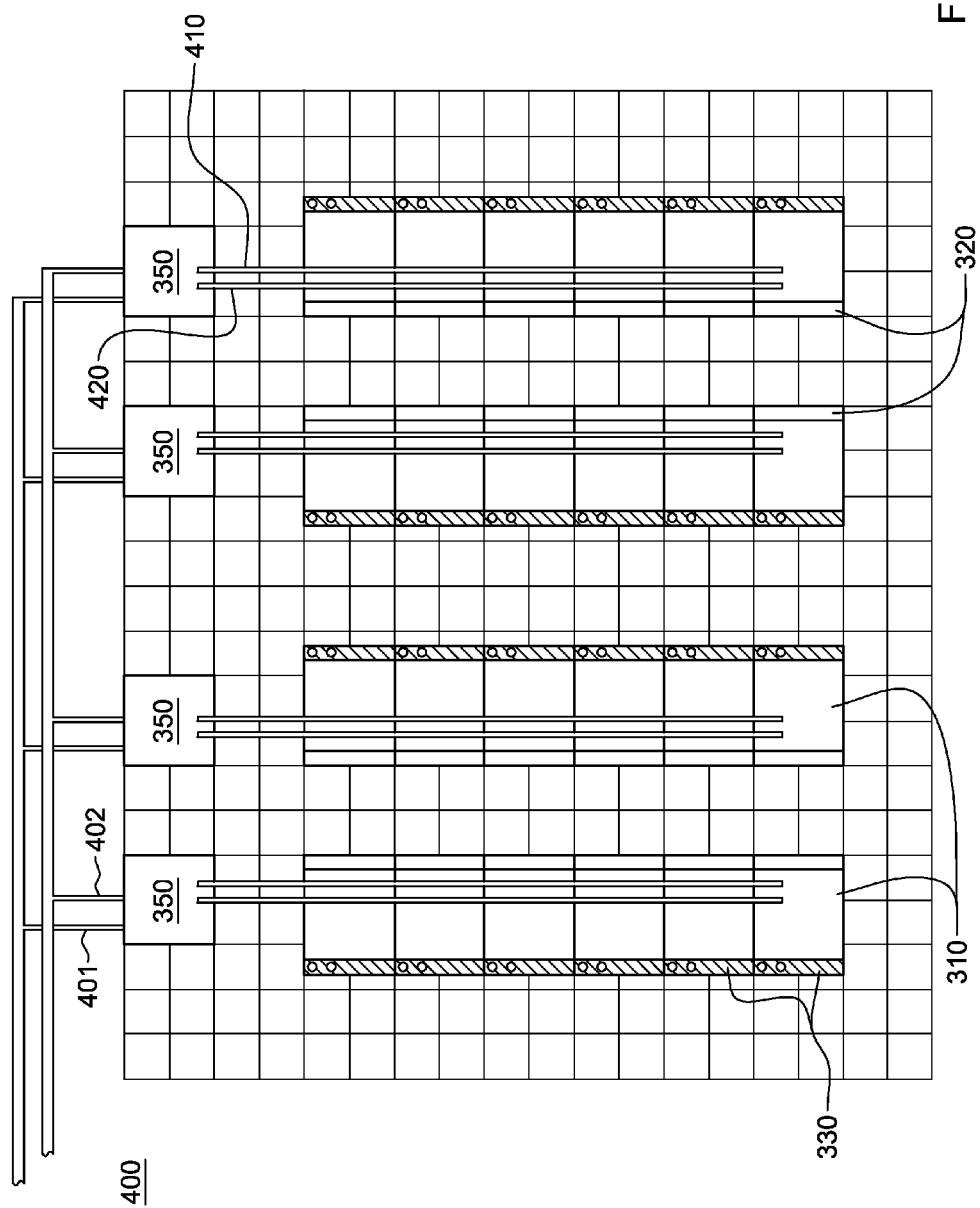
FIG. 4 depicts one embodiment of a data center layout comprising multiple coolant distribution units providing liquid coolant to a plurality of air-to-liquid heat exchangers associated with a plurality of electronics racks in the data center, which may be modified (in one embodiment) to include an air-cooling apparatus, in accordance with one or more aspects of the present invention.
Figure 9:
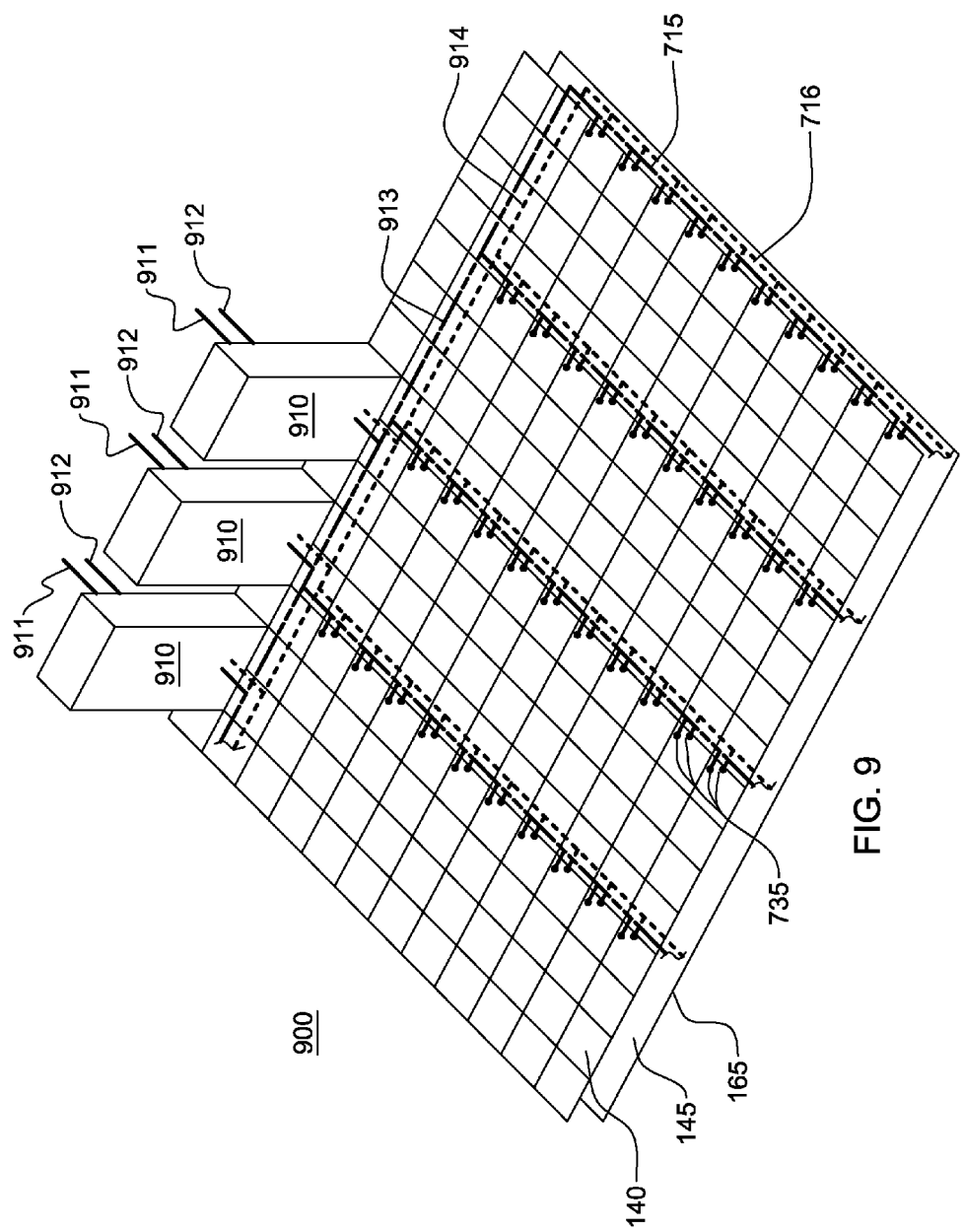
FIG. 9 is a partial depiction of a data center to employ one or more air-cooling walls of an air-cooling apparatus, and showing a coolant distribution apparatus, in accordance with one or more aspects of the present invention.

FIG. 4 is a plan view of one embodiment of a data center, generally denoted 400, employing cooled electronics systems, for example, such as depicted in FIG. 3. Data center 400 includes a plurality of rows of electronics racks 310, each of which includes an inlet door 320 at the air inlet side, and a hinged outlet door 330 at the air outlet side, such as described above in connection with the embodiment of FIG. 3. In this embodiment, each outlet door 330 supports an air-to-liquid heat exchanger and system coolant inlet and outlet plenums. Multiple coolant conditioning units 350, also referred to hereinbelow as pumping units, are disposed within the data center (along with one or more air-conditioning units (not shown)). As shown, in one embodiment, each pumping unit forms a system coolant distribution system with one row of a plurality of electronics racks. Each pumping unit includes a liquid-to-liquid heat exchanger where heat is transferred from a system coolant loop to a facility coolant loop. Chilled facility coolant, such as water, is received via facility coolant supply line 401, and is returned via facility coolant return line 402. System coolant, such as water, is provided via a system coolant supply header 410 extending over the respective row of electronics racks, and is returned via a system coolant return header 420 also extending over the respective row of electronics racks. In one embodiment, the system coolant supply and return headers 410, 420 are hard-plumbed within the data center, and preconfigured to align to the electronics racks in a respective row of electronics racks. Note that in an alternate embodiment of a data center, the system coolant supply pipes and system coolant return pipes could extend below respective rows of electronics racks, for example, below a raised floor of the data center. One embodiment of such a configuration is illustrated in FIG. 9, and described below.

Figure 5:
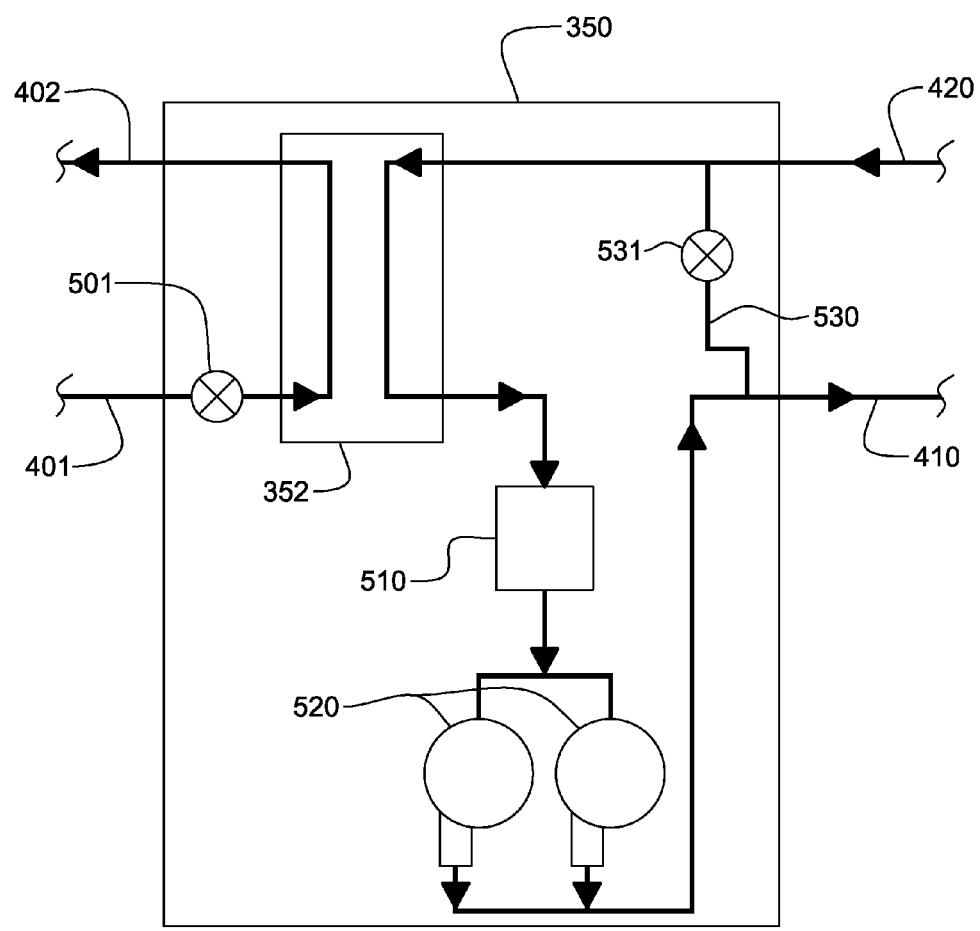
FIG. 5 is a schematic of one embodiment of a coolant distribution unit which may be employed (in one embodiment) in association with an air-cooling apparatus, in accordance with one or more aspects of the present invention.

FIG. 5 depicts one embodiment of a coolant distribution unit 350 for (for example) a data center such as depicted in FIG. 4. Liquid-to-liquid heat exchanger 352 cools system coolant passing through the system coolant loop (comprising system coolant supply 410 and system coolant return 420). In one embodiment, the system coolant has undergone heating (and possibly partial vaporization) within the respective air-to-liquid heat exchangers disposed within (for example) the outlet doors of the electronics racks. The facility coolant loop coupled to liquid-to-liquid heat exchanger 352 comprises facility coolant supply line 401 and facility coolant return line 402, which in one embodiment, provides chilled facility water to the liquid-to-liquid heat exchanger. A control valve 501 may be employed in facility coolant supply line 401 to control facility coolant flow rate through the liquid-to-liquid heat exchanger 352. After the system coolant cools within liquid-to-liquid heat exchanger 352, the coolant may be collected in a reservoir 510 for pumping via a redundant pump assembly 520 back to the rows of electronics racks via system coolant supply 410. As shown in FIG. 5, a bypass line 520 with a bypass valve 531 may be employed to control the amount of system coolant fed back through the system coolant supply, and hence, control temperature of system coolant delivered to the air-to-liquid heat exchangers (for example, mounted to the doors of the electronics racks).

The at least partially liquid-cooled data center approach of FIGS. 3 & 4 provides numerous advantages over an air-cooled only data center, such as depicted in FIGS. 1A & 1B. Since the air-cooling only approach is driven by specifying a highest acceptable rack intake temperature, the resulting operating point temperature inherently results in inefficiencies with respect to the cooling energy consumption within an air-cooled only data center. Further, the tortuous path for the airflow through the various expansions and contractions within the air-conditioning unit, as well as outside of it (for example, in the under-floor plenum, around cables and other blockages, and through perforated tiles), can contribute to inefficiencies in the cooled air delivery. In addition, there are numerous leakage paths for the cooled air, since the under-floor plenum typically is a very porous structure. For example, seams around the tiles are rarely air-tight; cable openings adjacent to the electronics racks bleed air into the data center; and the under-floor plenum itself is often fluidically coupled to other plenums. This means the air-conditioning units have to provide for much more cooled air than is actually required in front of the electronics racks for cooling the servers. The door-mounted air-to-liquid heat exchangers depicted in FIGS. 3 & 4 facilitate addressing many of these issues by cooling the airflow passing through the electronics racks at, for example, the air outlet sides of the racks, thereby lowering the temperature of any recirculating airflow, as well as the heat load to be extracted by the air-conditioning unit(s) (wherein employed) within the data center. Notwithstanding these door-mounted heat exchanger advantages, disclosed herein are air-cooling apparatuses and cooling approaches which further address cooling and energy efficiency issues within a data center.

As explained further below, disclosed herein, in one aspect, is an air-cooling apparatus which includes an air-cooling wall which facilitates cooling of airflow passing through one or more electronics racks of a data center. The air-cooling wall is free-standing from, and positioned in spaced relation to, either the air outlet sides or the air inlet sides of the more electronics rack(s) to facilitate cooling of the airflow passing through the rack(s). The air-cooling wall includes a wall panel support structure that is disposed separate from the electronics rack(s), and which supports at least one slidable wall panel. The at least one slidable wall panel includes at least one air-to-liquid heat exchanger slidably supported by the wall panel support structure and disposed in spaced relation to the air outlet or air inlet sides of the one or more electronics racks to facilitate at least a portion of the airflow passing through the one or more electronics racks also passing across the at least one air-to-liquid heat exchanger. The at least one air-to-liquid heat exchanger extracts heat from air passing thereacross. Advantageously, the one or more heat exchangers are slidable within the wall panel support structure in a direction transverse to a direction of the airflow through the one or more electronics racks. Slidable support of the at least one heat exchanger by the wall panel support structure facilitates access to the air outlet or air inlet sides of the one or more electronics racks with which the heat exchanger is disposed in spaced relation.

Advantageously, the air-cooling apparatuses disclosed herein are separate and independent of the electronics racks themselves. Thus, any combination of conventional (or non-conventional-sized) electronics racks could be arranged for cooling employing an air-cooling apparatus such as described herein. Further, the air-cooling apparatuses disclosed herein are free-standing within the data center separate from the electronics racks, and thus, the electronics racks can be repositioned, or the data center reconfigured, by simply repositioning different electronics racks in spaced relation with one or more air-cooling walls of the air-cooling apparatus. In addition, since the air-cooling apparatus is separate from the electronics racks, the slidable wall panels of the air-cooling wall may comprise larger heat exchangers, such as air-to-liquid heat exchangers that span two or more electronics racks in spaced relation therewith. Further, different-sized heat exchangers could be intermixed within the air-cooling wall. In one implementation, the wall panel support structure could comprise a multi-track structure which allows for multiple rows of heat exchangers, one or more of which are slidable to allow for access to the air outlet sides or air inlet sides of the electronics racks disposed in opposing relation with the air-cooling wall.

In one implementation, the air-cooling wall is modular in nature, so as to be adjustable with adjustments to the size of the row of electronics racks that the air-cooling wall is disposed in opposing relation to. Further, since the air-cooling wall is separate from the electronics racks, one or more of the slidable wall panels could be simply an air-permeable wall panel or could be an air-impermeable wall panel to customize the air-cooling wall depending upon the cooling requirements of the particular electronics rack(s) disposed in spaced relation to the wall. For example, higher-power-consuming racks generating a higher heat load may require a greater number of air-to-liquid heat exchangers than lower-power-consuming racks disposed in opposing relation to the air-cooling wall.

Advantageously, by separately providing an air-cooling wall spaced from the electronics racks, and allowing for slidable translation of the wall panels, including the air-to-liquid heat exchangers, the cost/performance benefits of using larger heat exchangers may be realized, without the tip/clearance issues associated with a pivoting door, such as in the case of the door-mounted heat exchangers of FIGS. 3 & 4. Further, depending on the data center, the air-cooling apparatuses disclosed herein could be used in place of using one or more standard air-conditioning units within the data center.

FIGS. 6A-6E depict various alternate embodiments of an air-cooling apparatus, in accordance with one or more aspects of the present invention. In each of these embodiments, the air-cooling apparatus is illustrated as comprising a single air-cooling wall. However, those skilled in the art will understand that the air-cooling apparatus could comprise two or more air-cooling walls. For example, a first air-cooling wall could be disposed at the air inlet sides of a row of electronics racks, and a second air-cooling wall at the air outlet sides of the electronics racks. In the embodiments illustrated in FIGS. 6A-6E, the air-cooling wall is disposed, by way of example, at the air outlet sides of the electronics racks.

Figure 6A:
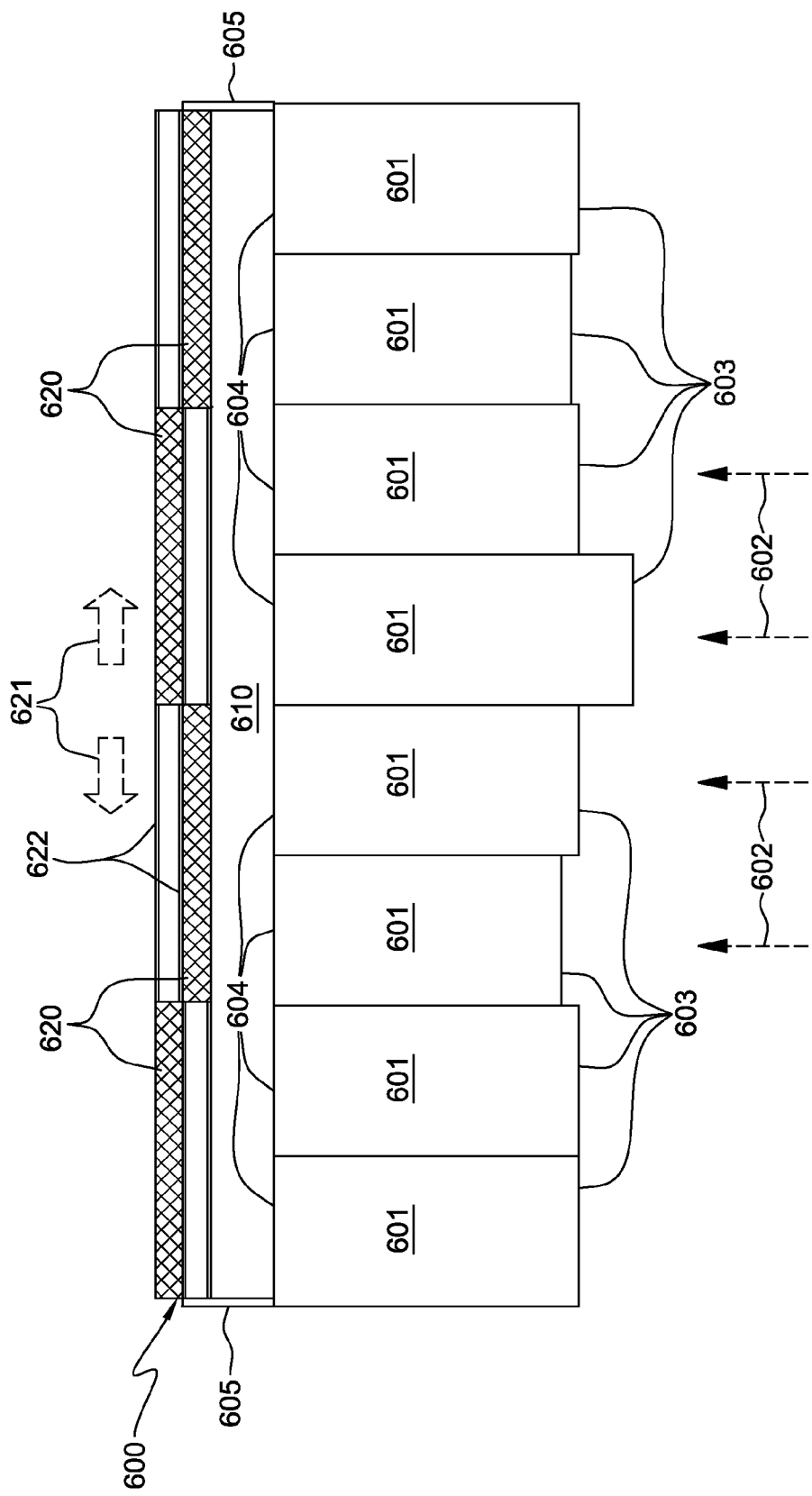
FIG. 6A depicts one embodiment of a data center layout comprising a row of electronics racks and an air-cooling apparatus comprising an air-cooling wall disposed in spaced, opposing relation to one of the air outlet sides or the air inlet sides (that is, with a reversed direction of airflow) of the electronics racks, in accordance with one or more aspects of the present invention.

In FIG. 6A, an air-cooling apparatus is illustrated comprising an air-cooling wall, generally denoted 600, which facilitates cooling of airflow 602 passing through a plurality of electronics racks 601 disposed in a row in a data center. As illustrated in FIG. 6A, airflow 602 passes through electronics racks 601 from an air inlet side 603 to an air outlet side 604 thereof. Further, as shown in FIG. 6A, electronics racks 601 may be differently-dimensioned from each other, while still being air-cooled by the air-cooling apparatus(es) disclosed herein. The air-cooling apparatus illustrated in FIG. 6A includes, in addition to air-cooling wall 600, ducting structures 605 which facilitate defining (in one embodiment) a common airflow plenum 610 between, for example, air outlet sides 604 of electronics rack 601 and air-cooling wall 600. As noted, airflow through the electronics racks is from air inlet sides 603 to air outlet sides 604 thereof, and is propelled (in one example) via one or more air-moving devices disposed within the electronics racks. Wall 600 is a passive air-cooling wall and is disposed so that airflow propelled through the electronics rack 601 by the air-moving devices within the racks also passes across, for example, one or more air-to-liquid heat exchangers of the air-cooling wall.

As shown in FIG. 6A, in one embodiment, air-cooling wall 600 comprises multiple slidable wall panels 620, each of which comprises (in this example) an air-to-liquid heat exchanger, slidably disposed in a wall panel support structure 622. These slidable wall panels (comprising air-to-liquid heat exchangers) are slidable in a direction 621 transverse to the direction of airflow 602 through electronics rack 601. Advantageously, the slidable wall panels 620, or more particularly, the air-to-liquid heat exchangers, may each be larger than an air outlet side or air inlet side of a single electronics rack with which the heat exchanger is disposed in spaced relation. In FIG. 6A, each slidable wall panel 620 is shown with a width approximately equal to the width of two electronics racks 601 in the row of electronics racks with which the cooling wall is disposed in opposing relation. In one embodiment, the wall panel support structure 622 may comprise a lower track support structure and an upper track support structure (not shown) below and above, respectively, slidable wall panels 620. In one embodiment, the wall panel support structure 622 comprises channels within which the slidable wall panels reciprocate.

Figure 6B:
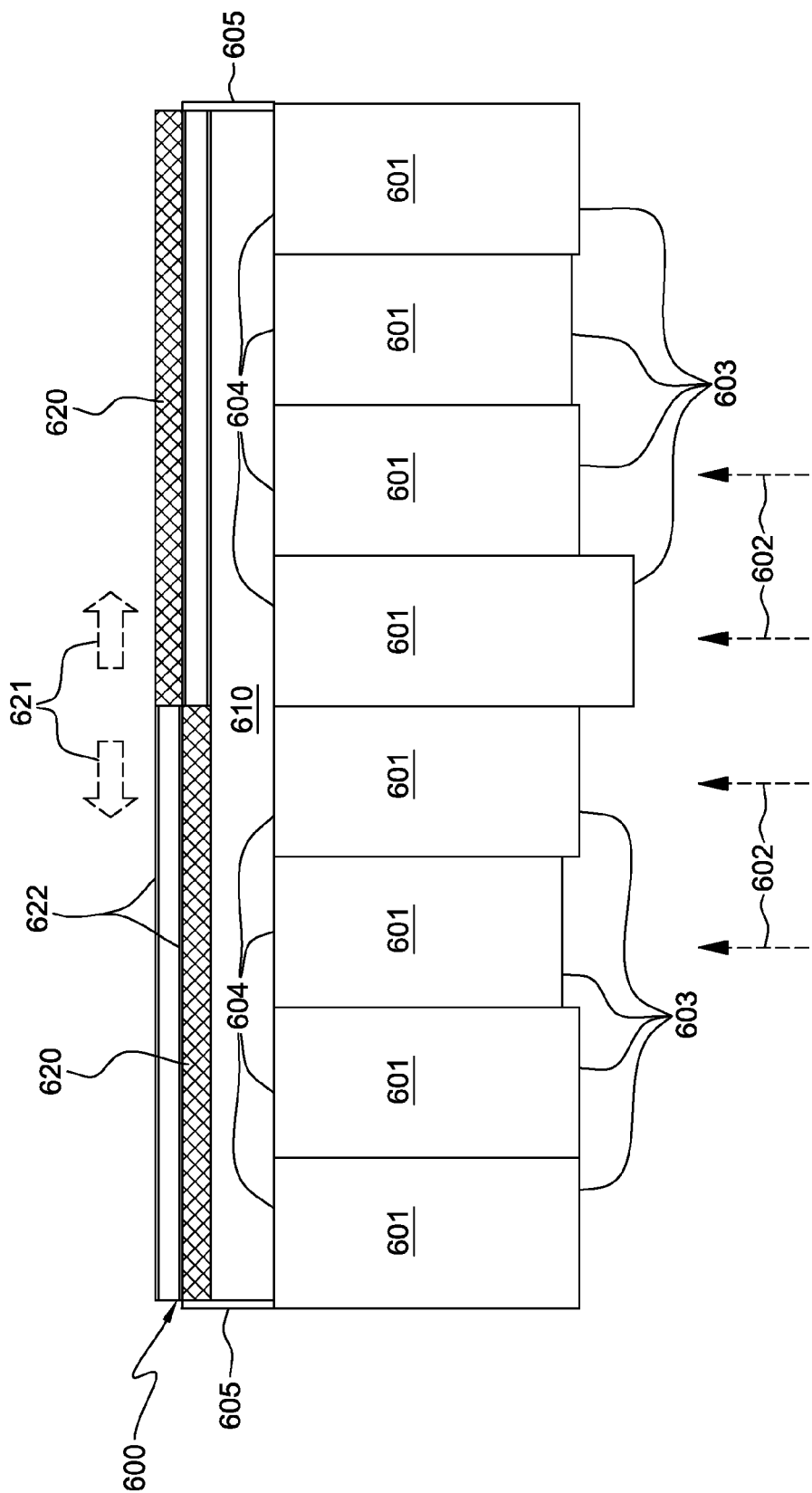
FIG. 6B depicts another embodiment of a data center layout comprising a row of electronics racks and an alternate embodiment of an air-cooling apparatus comprising an air-cooling wall disposed in spaced, opposing relation to one of the air outlet sides or the air inlet sides (with a reversed direction of airflow) of the electronics racks, in accordance with one or more aspects of the present invention.

In FIG. 6B, the air-cooling wall 600 is modified to include larger slidable wall panels 620, each of which comprises an air-to-liquid heat exchanger. By providing larger slidable wall panels with larger heat exchangers, even larger heat exchange surface areas are provided in opposing relation to, for example, the air outlet sides of the electronics racks 601. This can enhance coolant distribution by requiring a fewer number of coolant plenums and hoses coupling the air-to-liquid heat exchangers to, for example, the system coolant supply and returns of the data center.

In FIG. 6C, air-cooling wall 600 is modified to include differently-sized slidable wall panels 620a, 620b, which may be advantageously employed, depending upon the rack heat load being generated by the individual electronics racks 601 in the row of electronics racks. Further, although not shown, two slidable wall panels could be selectively disposed adjacent to each other in overlapping relation, parallel to the air outlet or air inlet sides of one or more electronics racks in the row, to effectively double the width of the air-to-liquid heat exchangers held by the slidable wall panels in the direction of airflow 602 through the electronics racks.

Figure 6D:
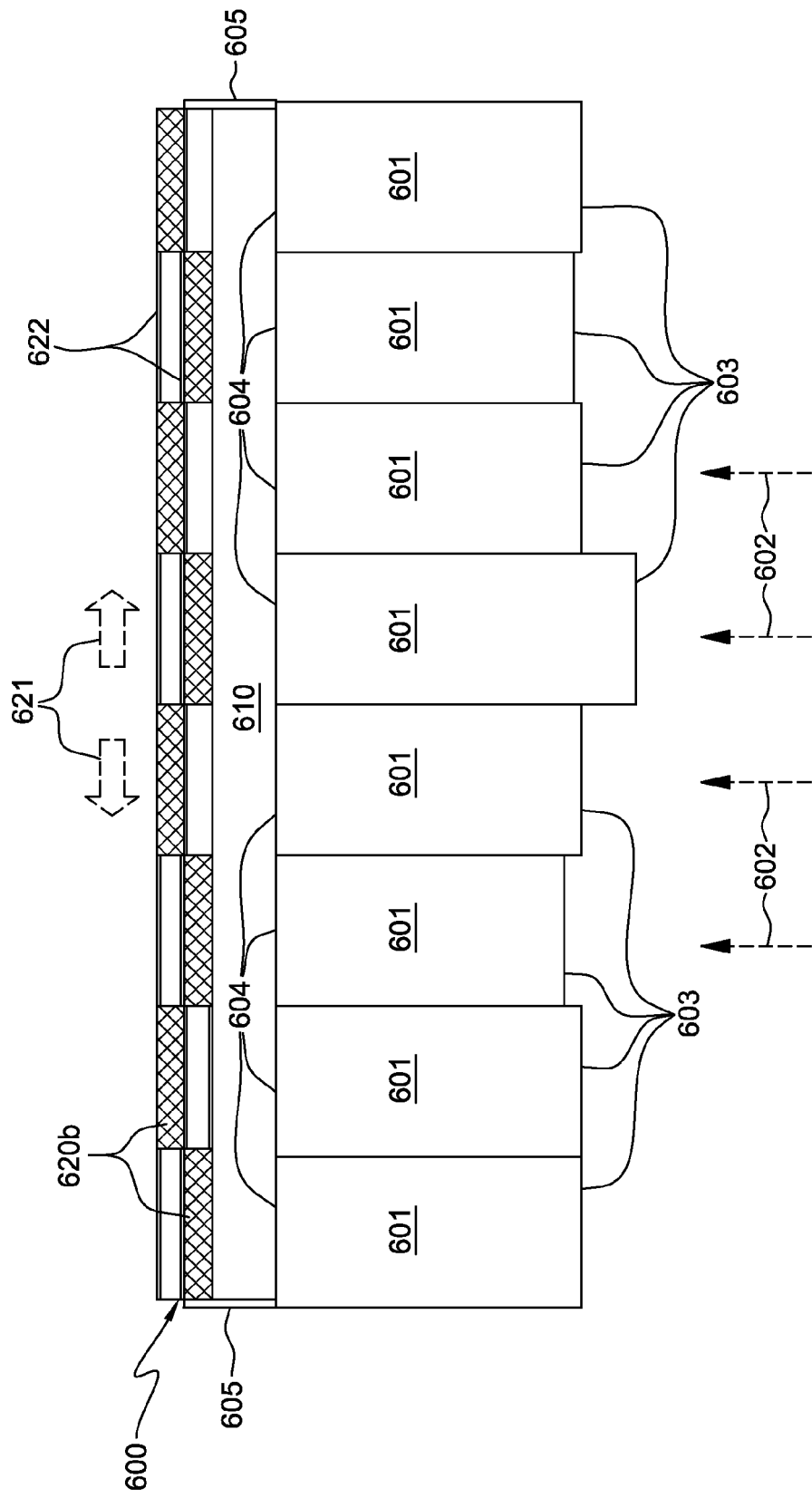
FIG. 6D depicts another embodiment of a data center layout comprising a row of electronics racks and an alternate embodiment of an air-cooling apparatus comprising an air-cooling wall disposed in spaced, opposing relation to one of the air outlet sides or the air inlet sides (with a reversed direction of airflow) of the electronics racks, in accordance with one or more aspects of the present invention.

In FIG. 6D, the slidable wall panels 620b are sized and configured to correspond in size and number with the size and number of electronics racks 601 disposed in opposing relation to the air-cooling wall 600. In this example, each slidable wall panel 620b is assumed to comprise an air-to-liquid heat exchanger.

Figure 6E:
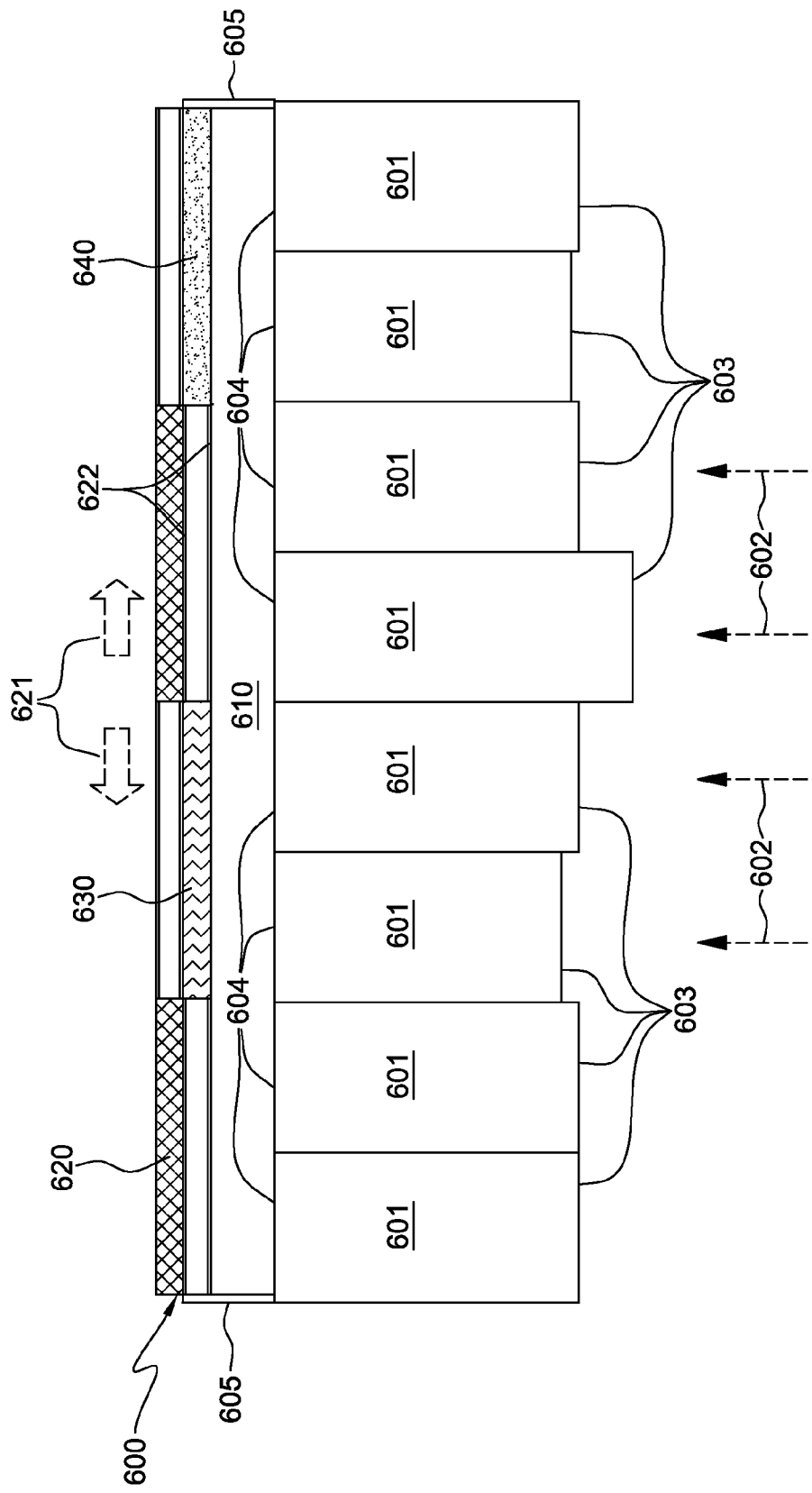
FIG. 6E depicts another embodiment of a data center layout comprising a row of electronics racks and an alternate embodiment of an air-cooling apparatus comprising an air-cooling wall disposed in spaced, opposing relation to one of the air outlet sides or the air inlet sides (with a reversed direction of airflow) of the electronics racks, in accordance with one or more aspects of the present invention.

In FIG. 6E, a further wall variation is illustrated, wherein one or more of the wall panels is configured as an air-permeable wall panel 630, and one or more of the wall panels is configured as an air-impermeable wall panel 640. In one embodiment, air-impermeable wall panel 640 is a solid wall structure. Any desired combination of slidable wall panels 620 with air-to-liquid heat exchangers, air-permeable wall panels 630, and air-impermeable wall panels 640 may be employed. Decision whether to include an air-permeable wall panel or air-impermeable wall panel may include an evaluation of the heat load to be extracted from the airflow passing through the individual electronics racks in the row of electronics racks 601 by the air-cooling wall 600. In one embodiment, air-permeable wall panel 630 and air-impermeable wall panel 640 are each slidable wall panels, supported by wall panel support structure 622.

Figure 7:
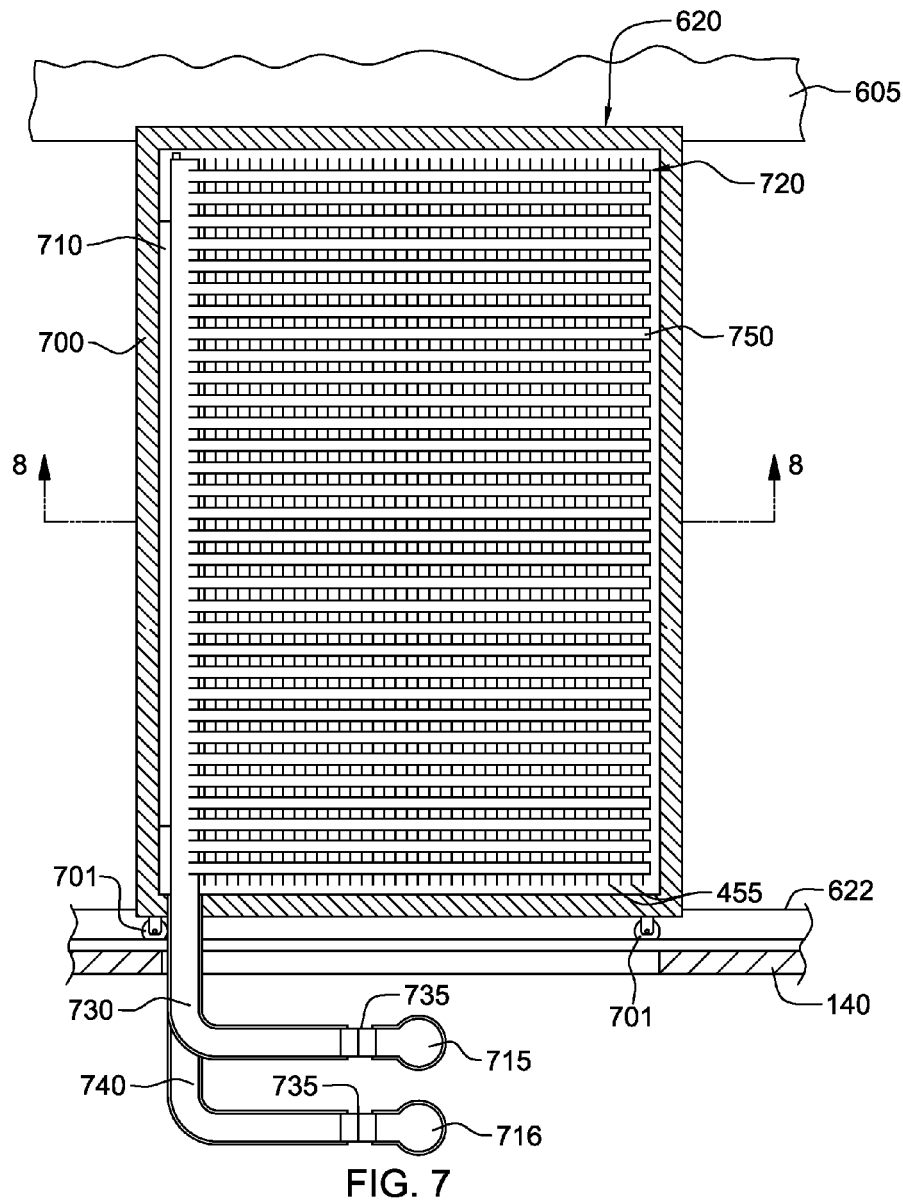
FIG. 7 is a partial cross-sectional elevational view of one embodiment of a wall panel support structure and a slidable wall panel comprising an air-to-liquid heat exchanger, and taken along line 7-7 in FIG. 8, in accordance with one or more aspects of the present invention.
Figure 8:
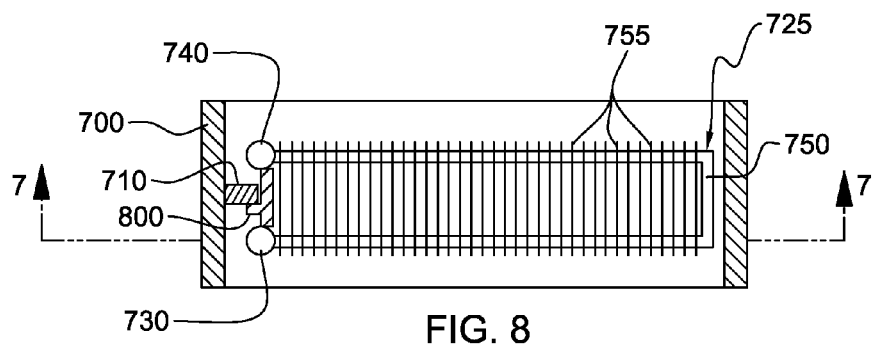
FIG. 8 is a cross-sectional top plan view of the slidable wall panel of FIG. 7, taken along line 8-8 in FIG. 7, in accordance with one or more aspects of the present invention.

FIGS. 7 & 8 depict one embodiment of a slidable wall panel 620 comprising an air-to-liquid heat exchanger 720, in accordance with an aspect of the present invention. As illustrated, slidable wall panel 620 comprises a frame 700, to which wheels 701 mount at a lower surface thereof. Optionally, wheels (not shown) may also be mounted to an upper surface of frame 700. Wheels 701 facilitate sliding of the slidable wall panel 620 within respective tracks of the wall panel support structure 622 affixed, for example, to the floor of the data center (and optionally, to a ceiling of the data center). Slidable wall panel 620 includes, in the depicted embodiment, system coolant inlet and outlet plenums 730, 740, and a rigid support structure 800, which attaches, for example, by brazing or soldering, to a plate 710 secured between the system coolant inlet plenum 730 and system coolant outlet plenum 740.

In the embodiment of FIG. 7, the system coolant inlet and outlet plenums 730, 740 extend downwards from the slidable wall panel 620 through an opening in the wall panel support structure 622 and the raised floor 140 to which the structure 622 mounts, into (for example) an air supply plenum disposed below the raised floor of the data center. Connect couplings 735 may be employed to couple the system coolant inlet and outlet plenums 730, 740 to system coolant supply and return 715, 716, respectively, of the data center. In one embodiment, these connect couplings 735 are quick connect couplings, such as the commercially available quick connect couplings offered by Colder Products Company, of St. Paul, Minn., USA, or Parker Hannifin, of Cleveland, Ohio, USA.

In the depicted embodiment, air-to-liquid heat exchanger 720 comprises a plurality of horizontally-oriented heat exchange tube sections 725. These heat exchange tube sections 725 each comprise a coolant channel 750 having an inlet and an outlet, with each coolant channel being coupled to the system coolant inlet plenum 730 and each coolant channel outlet being coupled to the system coolant outlet plenum 740. A plurality of fins 755 are attached to horizontally-oriented heat exchange tube sections 725 for facilitating transfer of heat from air passing across the air-to-liquid heat exchanger 720 to coolant flowing through the plurality of heat exchange tube sections 725. In one embodiment, the plurality of fins 755 are vertically-oriented, rectangular fins attached to horizontally-oriented heat exchange tube sections 725. Coolant distribution to the heat exchangers, via the system coolant supply and return 715, 716, can be facilitated employing a plurality of coolant distribution units, such as described above in connection with FIGS. 3-5.

In FIG. 9, a data center 900 layout is illustrated, wherein a plurality of coolant distribution units 910 are employed in distributing system coolant through multiple system coolant supplies and returns 715, 716 to the air-to-liquid heat exchangers slidably mounted within one or more air-cooling walls of an air-cooling apparatus such as described above in connection with FIGS. 6A-8. As illustrated in FIG. 9, the coolant distribution piping includes a primary supply line 913 and a primary return line 914, as well as multiple system coolant supplies 715 and system coolant returns 716 extending from the primary lines. In the depicted embodiment, these system coolant supplies and returns are disposed within the supply air plenum 145 defined between raised floor 140 of data center 900 and sub-floor 165. Quick connect couplings 735 are provided for connecting individual heat exchangers to the respective coolant supply and return 715, 716. The quick connect couplings 735 define a relatively dense grid of coupling connections mounted to the respective system coolant supplies and returns, through which system coolant is supplied and returned. Providing a dense grid of coupling connections 735 facilitates reconfiguration of the air-cooling walls disclosed herein. For example, by disconnecting an air-to-liquid heat exchanger of a slidable wall panel from one location, the wall panel can be readily slid via the wall panel support structure to a different location in the air-cooling wall, and reconnected to the system coolant supply and return 715, 716 via a different set of quick connect couplings 735.

Note that by employing flexible hoses of sufficient length, the air-to-liquid heat exchangers of the slidable wall can be moved a limited distance without disconnecting the hoses coupling the heat exchangers to the system coolant supplies and returns 715, 716. For instance, for maintenance of the electronics racks, the slidable wall panels with the air-to-liquid heat exchangers could be configured to move a limited distance without disconnecting the hoses to allow a service technician access to, for example, the air outlet side(s) of the electronics rack(s).

The three coolant distribution units (CDUs) 910 illustrated in FIG. 9 are presented by way of example only. In certain implementations, one CDU may be employed, while in others two or more than three may be utilized. Each coolant distribution unit 910 includes a liquid-to-liquid heat exchanger, which in one example, receives 5-10° C. facility coolant from a facility chiller plant (not shown) and cools the system coolant to a temperature in the range of 12-20° C., in order to remain above the room dew point temperature. In addition to a liquid-to-liquid heat exchanger, each CDU may include one or more of a power/control element, a reservoir/expansion tank, a pump, facility coolant inlet and outlet pipes 911, 912, and system coolant supply and return lines or pipes. Further, each CDU may be designed with multiple coolant pumps for redundancy, as well as more sophisticated control algorithms.

Note that in the implementation depicted in FIGS. 7-9, the inlet and outlet plenums of the air-to-liquid heat exchangers mount within the slidable wall panel and are coupled to system coolant supplies and returns disposed beneath a raised floor. Alternatively, system coolant supply and return headers for the air-to-liquid heat exchangers may be mounted overhead the electronics racks within the data center. In such an embodiment, system coolant enters and exits the respective coolant inlet and outlet plenums at the top of the slidable wall panel, for example, using flexible coolant supply and return hoses, which may be partially looped and sized to facilitate sliding of the slidable wall panel containing an air-to-liquid heat exchanger, without necessarily requiring disconnecting of the coolant supply and return hoses.

FIGS. 10-13 depict various data center layouts utilizing different configurations of air-cooling apparatuses, in accordance with aspects of the present invention.

Figure 10:
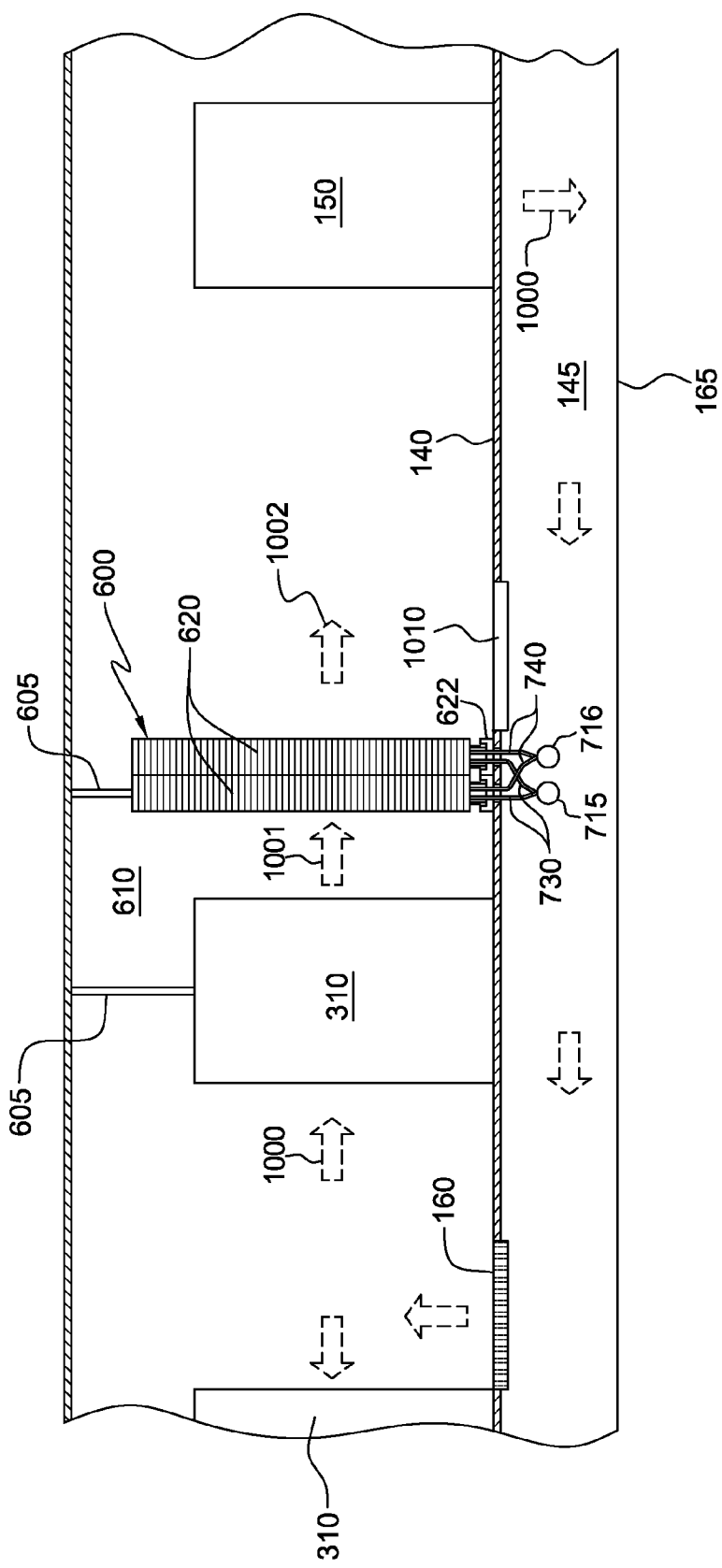
FIG. 10 is an elevational view of one embodiment of a raised floor layout of a data center including an air-cooling apparatus comprising an air-cooling wall, in accordance with one or more aspects of the present invention.

In FIG. 10, a raised floor layout of a data center is illustrated, wherein one or more electronics racks 310 are disposed on a raised floor 140 of the data center. As illustrated, the data center further includes an air-conditioning unit 150 which provides cooled air 1000 (via an under-floor, supply air plenum 145) to the cold air aisle(s) of the data center through one or more perforated floor tiles 160. The supply air plenum 145 is defined between raised floor 140 and a sub-floor 165 of the data center. In the embodiment illustrated, cooled air 1000 is taken in through the air inlet sides of electronics racks 310 and is exhausted as heated air 1001 from the air outlet sides of the electronics racks. In order to facilitate cooling of heated air 1001 (for example, prior to return to the air inlet sides of the racks), an air-cooling apparatus is provided which includes an air-cooling wall 600 in spaced, opposing relation to (in this example) the air outlet sides of electronics racks 310, in a manner such as described above in connection with FIGS. 6A-6E. Air-cooling wall 600 includes a wall panel support structure 622 which, in one embodiment, is a multi-track structure allowing for multiple rows of slidable wall panels 620. One or more slidable wall panels 620 include air-to-liquid heat exchangers, sized and configured to extract heat from the heated airflow 1001 egressing from the air outlet sides of electronics racks 310.

The extracted heat is transferred via coolant flowing through a coolant distribution system which includes system coolant inlet plenums 730 and system coolant outlet plenums 740 coupled (for example, via one or more flexible hoses) to system coolant supply and returns 715, 716, disposed in the supply air plenum 145 of the data center. One or more access tiles 1010 may be provided in raised floor 140 to facilitate access to the under-floor plenum in the region of the system coolant supply and returns 715, 716, and in particular, to facilitate connecting or disconnecting of the plenums (or associated flexible hoses) via one or more quick disconnects, in a manner such as described above in connection with FIGS. 7-9.

Ducting structures 605 are provided surrounding electronics racks 310 and cooling wall 600 to facilitate defining, in this example, a common airflow plenum 610, through which heated air 1001 traverses from, for example, the multiple electronics racks 310 disposed in spaced, opposing relation to the cooling wall 600. Ducting structures 605 are air-impermeable structures, which essentially direct all airflow passing through the electronics racks 310 to pass across the air-to-liquid heat exchangers of the slidable wall panels 620. After passing across the air-cooling wall 600, the airflow 1002 is cooler, thereby reducing the cooling load on the one or more air-conditioning units 150 of the data center.

In the embodiment illustrated, wall panel support structure 622 mounts to the raised floor 140. As noted above, however, in an alternate embodiment, additional wall panel support structures could be provided above the slidable wall panels 620 depending, for example, on size and strength requirements for the air-cooling wall.

Figure 11:
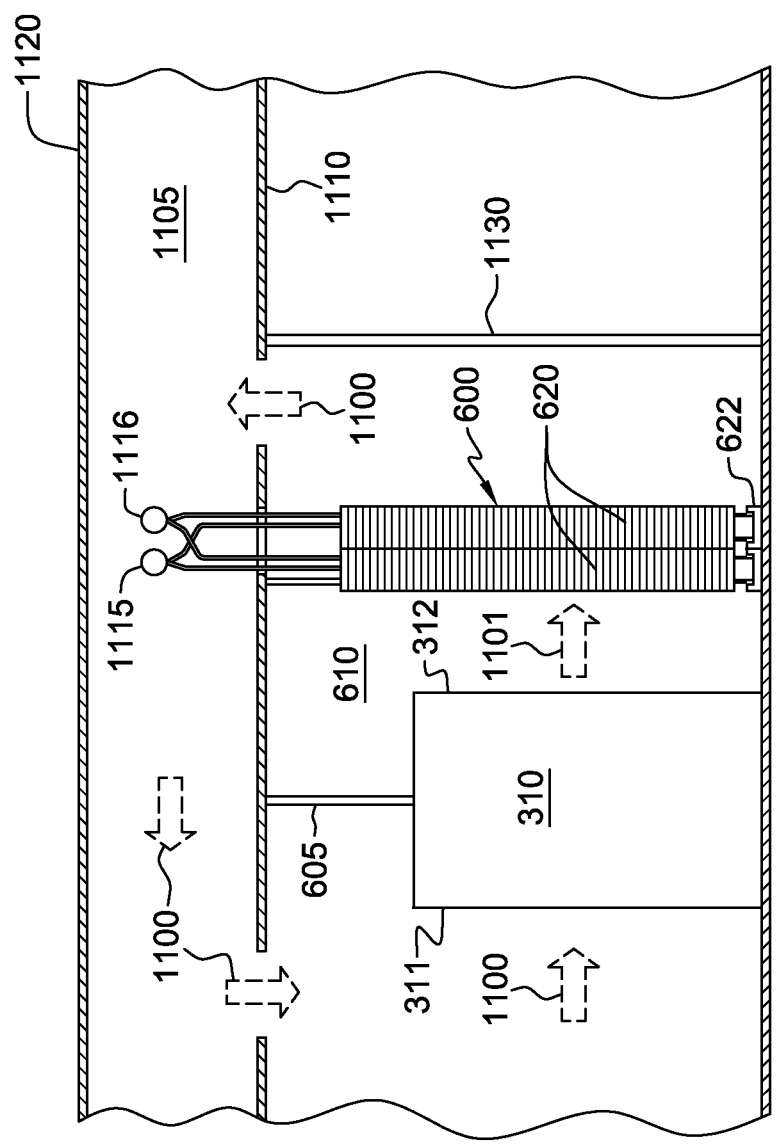
FIG. 11 is an elevational view of one embodiment of a non-raised floor layout of a data center including an air-cooling apparatus comprising an air-cooling wall, in accordance with one or more aspects of the present invention.

FIG. 11 depicts an alternate implementation of a data center and an air-cooling apparatus, in accordance with an aspect of the present invention. In this alternate implementation, the data center is a non-raised floor data center comprising one or more electronics racks 310 to be at least partially air-cooled via an airflow 1100 ingressing through an air inlet side 311 and egressing from an air outlet side 312 of the electronics racks 310. The cooling apparatus comprises a cooling wall 600, such as described above in connection with FIGS. 6A-8, which is configured and disposed to facilitate cooling of airflow passing through electronics rack 310. The cooling wall includes, in one embodiment, multiple slidable wall panels 620 supported by a wall panel support structure 622, which (in one embodiment) comprises a multi-track structure that facilitates slidable movement of the slidable wall panels in a direction transverse to the direction of airflow 1100 through electronics rack 310, as explained above in connection with FIGS. 6A-6E.

In the embodiment illustrated, wall panel support structure 622 is a multi-track structure supporting two rows of slidable wall panels, which may be offset (as described above) in a direction transverse to the direction of airflow through the electronics racks. Multiple slidable wall panels 620 include air-to-liquid heat exchangers for extracting heated from the heated airflow 1101 egressing from the electronics racks 310, as the heat air passes across the air-to-liquid heat exchangers within the slidable wall panels 620. Flexible coolant supply and return hoses couple the system coolant inlet and outlet plenums of the air-to-liquid heat exchangers within the slidable wall panels to system coolant supply and return headers 1115, 1116 disposed, for example, in an overhead air return plenum 1105 of the data center. In the embodiment illustrated, overhead air return plenum 1105 resides between a drop ceiling 1110 and an upper ceiling 1120 of the data center. In one embodiment, the system coolant supply and return headers 1115, 1116 facilitate distribution of coolant to the individual air-to-liquid heat exchangers slidably supported within the air-cooling wall, in a manner similar to the system coolant supplies and returns 715, 716 described above. In this embodiment, in addition to ducting structures 605, which facilitate defining a common airflow plenum 610 between air outlet sides 312 of electronics racks 310 and air-cooling wall 600, air return ducting structures 1130 are provided, directing cooled airflow 1100 egressing from air-cooling wall 600 back to the air inlet sides 311 of electronics racks 310 for use in cooling one or more heat-generating components within the individual electronics racks. One or more air-moving devices (not shown) may be disposed within, for example, the overhead return plenum 1105, to facilitate recirculation of cooled airflow 1100 egressing from air-cooling wall 600 to the air inlet sides 311 of electronics racks 310. In this implementation, it is assumed that essentially all heat load extracted by the airflow through the electronics racks is subsequently rejected to the system coolant flowing through the air-to-liquid heat exchangers mounted within the slidable wall panels of the air-cooling wall. Thus, in this implementation, there is no conventional air-conditioning unit disposed within the data center, and heat transferred to the system coolant is ultimately rejected to an outside environment, whether to air or other liquid.

Figure 12:
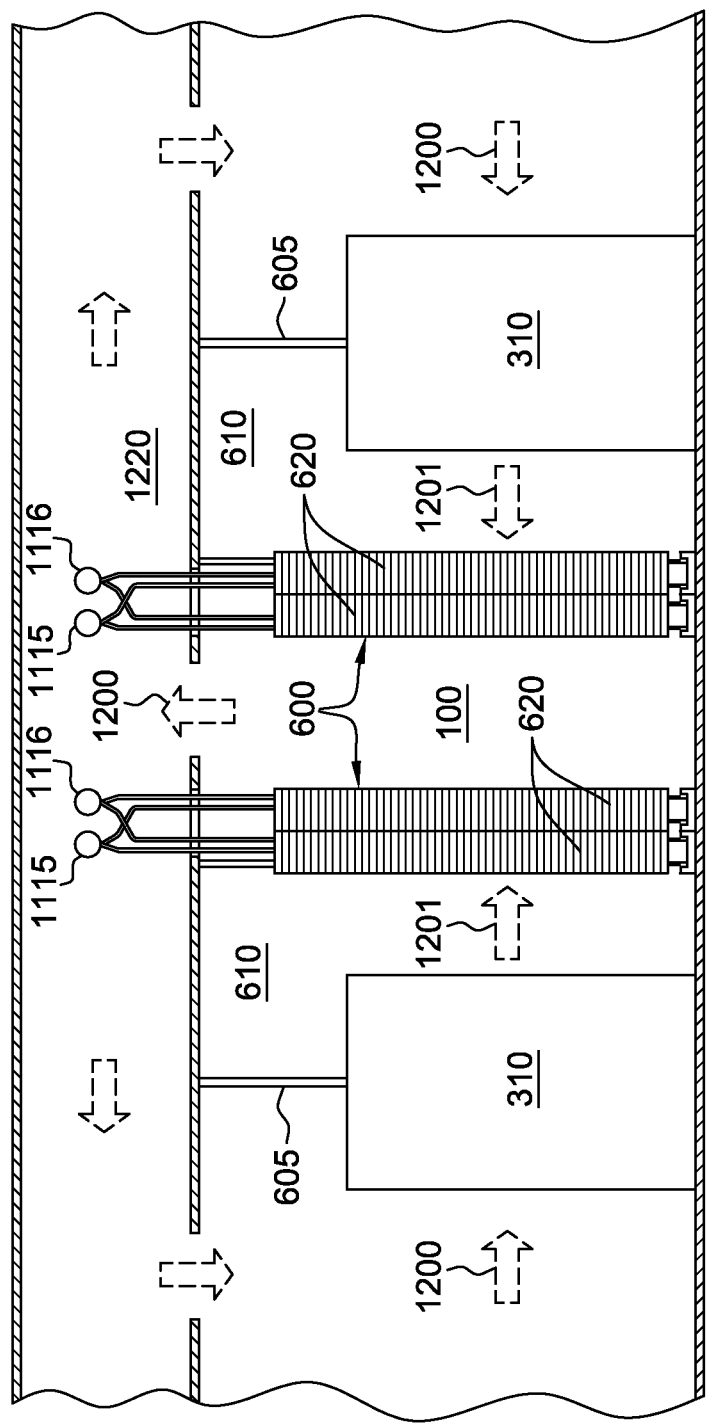
FIG. 12 is an elevational view of another embodiment of a non-raised floor layout of a data center including an air-cooling apparatus comprising multiple air-cooling walls, in accordance with one or more aspects of the present invention.

FIG. 12 is similar to the data center described above in connection with FIG. 11, except for the addition of an additional row of electronics racks 310 and an additional air-cooling wall 600. In this data center, return ducting structures are employed in directing the cooled airflow egressing from the air-cooling walls 600 back to the air inlet sides of the respective rows of electronics racks 310. In operation, cooled air 1200 is taken in through the air inlet sides of electronics racks 310, and heated air 1201 is exhausted into respective airflow plenums 610, which is subsequently cooled by the respective air-cooling walls 600. As the heated air 1201 passes across the multiple air-to-liquid heat exchangers within the slidable wall panels 620 of air-cooling walls 600, heat is rejected to the system coolant flowing therethrough producing cooled air 1200. This cooled air 1200 is then returned via overhead returns 1220 ducting structures to the air inlet sides of the rows of racks (aided, for example, by one or more air-moving devices (not shown) disposed within the overhead returns 1220). As in the embodiment of FIG. 11, no conventional air-conditioning unit may be required in a data center using the air-cooling apparatus configuration of FIG. 12.

Figure 13:
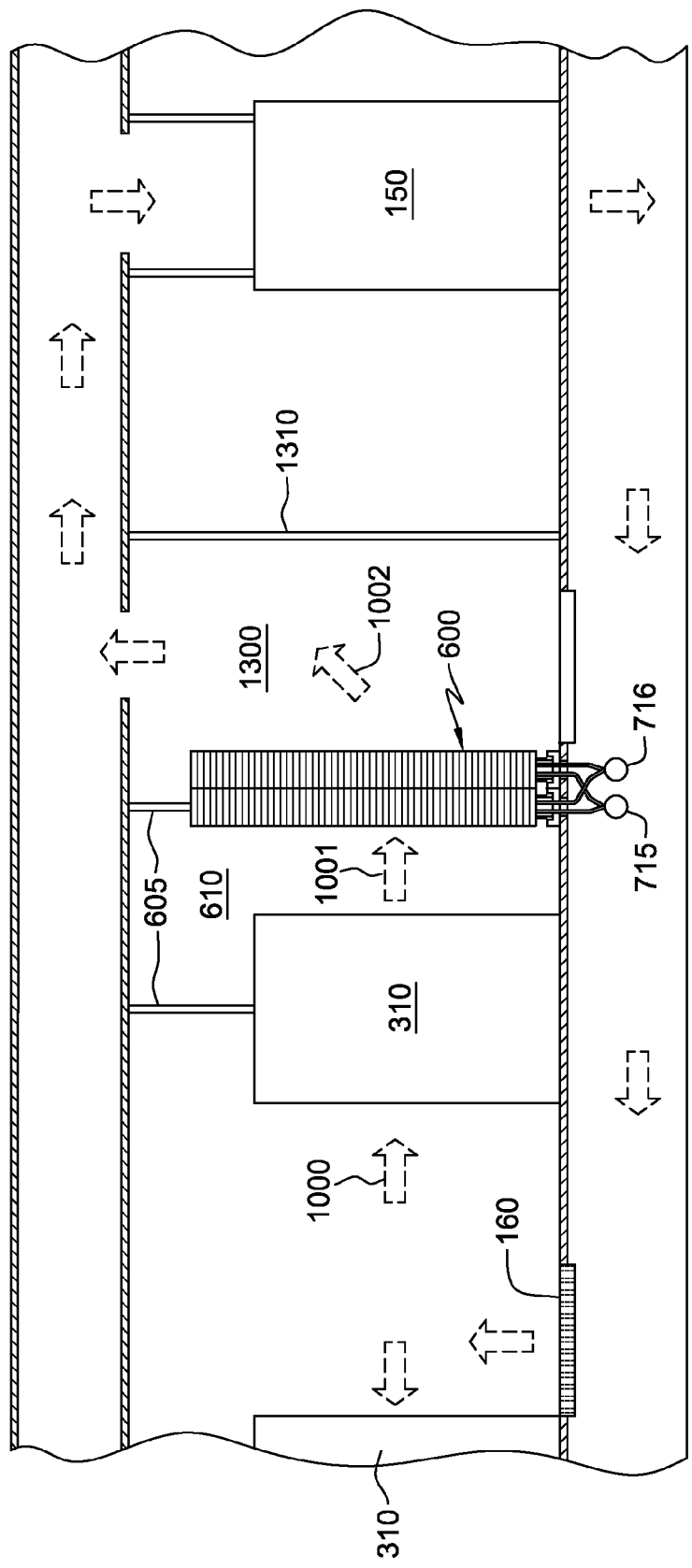
FIG. 13 is an elevational view of an alternate embodiment of a raised floor layout of a data center including an air-cooling apparatus comprising an air-cooling wall, in accordance with one or more aspects of the present invention.

FIG. 13 depicts a data center variation on the air-cooling apparatus and data center described above in connection with FIG. 10. In this embodiment, rather than cooled air 1002 egressing unrestricted into the data center, the cooled air is directed via a return air plenum 1300 to the air intake of one or more air-conditioning units 150 of the data center. One or more return ducting structures 1310 (and optionally, one or more air-moving devices within the return air plenum) are provided to facilitate return of the cooled air 1002 to the air-conditioning units. In operation, a portion of the heat in the heated airflow 1001 is rejected to coolant flowing through the air-to-liquid heat exchangers within the air-cooling wall 600 to provide cooled air 1002, which is then subsequently further cooled by the air-conditioning units 150 before return through the perforated tiles 160 to the cold air aisles of the data center as cold air 1000 to be taken in through the air inlet sides of the electronics racks 310.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiment with various modifications as are suited to the particular use contemplated.

What is claimed is:

1. An air-cooling apparatus comprising:
    an air-cooling wall configured for data center-level cooling and facilitating cooling of airflow passing through a plurality of electronics racks positioned side-by-side in a row of the data center, the plurality of electronics racks comprising an air inlet side and an air outlet side, the air inlet and air outlet sides respectively enabling ingress and egress of air through the plurality of electronics racks, and the air-cooling wall being air-permeable and facilitating cooling of airflow passing through the plurality of electronics racks, the air-cooling wall being disposed separate and free-standing from the plurality of electronics racks and in spaced relation to one of the air outlet side or the air inlet side of the plurality of electronics racks when in operation, wherein the air-cooling wall is sized and configured with a width spanning the plurality of electronics racks, and comprises:
        a wall panel support structure independent and separate from the electronics racks, the wall panel support structure comprising a first track and a second track supporting multiple slidable wall panels free-standing from the plurality of electronics racks, wherein the first track and the second track support different slidable wall panels of the multiple slidable wall panels, and are disposed adjacent to each other at the one of the air outlet side or the air inlet side of the plurality of electronics racks positioned side-by-side in the row;
        the multiple slidable wall panels comprising at least one air-to-liquid heat exchanger slidably supported by one of the first track of the wall panel support structure or the second track of the wall panel support structure, the multiple slidable wall panels being disposed in spaced relation to the one of the air outlet sides or the air inlet sides of the plurality of electronics racks to facilitate airflow passing through the plurality of electronics racks also passing across the at least one air-to-liquid heat exchanger, the at least one air-to-liquid heat exchanger extracting heat from air passing therea-cross, and the first track of the wall panel support structure being disposed closer to the one of the air outlet side or the air inlet side of the plurality of electronics racks than the second track of the wall panel support structure; and
        wherein one or more slidable wall panels slidably supported by the first track or the second track are configured to be slidably moved to overlap one or more other slidable wall panels slidably supported by the second track or the first track, respectively, while still allowing continued cooling of the airflow passing through the plurality of electronics racks by the at least one air-to-liquid heat exchanger.

2. The air-cooling apparatus of claim 1, wherein the plurality of electronics racks are spaced from the air-cooling wall a distance larger than a thickness of the air-cooling wall in a direction of airflow through the air-cooling wall.

3. The air-cooling apparatus of claim 1, wherein the at least one slidable wall panel comprising the at least one air-to-liquid heat exchanger is sized and configured to span multiple electronics racks of the plurality of electronics racks.

4. The air-cooling apparatus of claim 1, wherein at least two electronics racks of the plurality of electronics racks are differently-sized electronics racks and the air-cooling wall and the at least one air-to-liquid heat exchanger have a height greater than a height of at least one electronics rack of the at least two differently-sized electronics racks.

5. The air-cooling apparatus of claim 1, wherein the air-cooling wall is disposed in opposing relation to the air outlet sides of the plurality of electronics racks, and wherein the air-cooling apparatus further comprises return ducting structures directing airflow passing across the at least one air-to-liquid heat exchanger to one of an air-conditioning unit of the data center or the air inlet sides of the plurality of electronics racks.

6. The air-cooling apparatus of claim 1, wherein the multiple slidable wall panels comprise multiple air-to-liquid heat exchangers slidably supported by the wall panel support structure and disposed in opposing relation to the one of the air outlet sides or the air inlet sides of the plurality of electronics racks, the multiple air-to-liquid heat exchangers being slidable within the wall panel support structure in a direction transverse to a direction of the airflow through the plurality of electronics racks and being at least partially offset laterally in the direction transverse to the direction of the airflow through the plurality of electronics racks.

7. The air-cooling apparatus of claim 6, wherein at least two slidable wall panels comprising at least two air-to-liquid heat exchangers of the multiple air-to-liquid heat exchangers of the air-cooling wall are sized and configured to span a different number of electronics racks of the plurality of electronics racks.

8. The air-cooling apparatus of claim 6, wherein at least one slidable wall panel of the multiple slidable wall panels is an air-impermeable wall panel lacking any air-to-liquid heat exchanger.

9. The air-cooling apparatus of claim 6, wherein a first air-to-liquid heat exchanger of the multiple air-to-liquid heat exchangers is slidably supported within the first track of the wall panel support structure, and a second air-to-liquid heat exchanger of the multiple air-to-liquid heat exchangers is slidably supported within a second track of the wall panel support structure, wherein the first track and the second track are disposed parallel to each other and perpendicular to the direction of airflow through the plurality of electronics racks.

10. The air-cooling apparatus of claim 6, wherein the wall panel support structure comprises a lower track support stricture supporting the multiple air-to-liquid heat exchangers of the plurality of wall panels in slidable relation therewith, and wherein the lower track support structure is spaced from and freestanding relative to the plurality of electronics racks.

11. The air-cooling apparatus of claim 10, further comprising ducting structures facilitating defining a common airflow plenum between the one of the air outlet sides or air inlet sides of the plurality of electronics racks and the multiple air-to-liquid heat exchangers of the air-cooling wall.

12. The air-cooling apparatus of claim 11, wherein the air-cooling wall is disposed in opposing relation to the air outlet sides of the plurality of electronics racks, and wherein the air-cooling apparatus further comprises return ducting structures for directing airflow passing across the multiple air-to-liquid heat exchangers to the air inlet sides of the plurality of electronics racks.

13. The air-cooling apparatus of claim 1, wherein the at least one air-to-liquid heat exchanger is disposed in spaced opposing relation to the one of the air outlet sides or the air inlet sides of the plurality of electronics racks, and is slidable within the wall panel support structure in a direction transverse to a direction of airflow through the plurality of electronics racks, and wherein slidable support of the at least one air-to-liquid heat exchanger by the wall panel support structure facilitates access to the one of the air outlet side or the air inlet side of the plurality of electronics rack with which the at least one air-to-liquid heat exchanger is disposed in opposing relation.

14. A data center comprising:
a plurality of electronics racks disposed side-by-side in a row, the plurality of electronics racks being separate, freestanding electronics racks, and comprising an air inlet side and air outlet side, the air inlet and air outlet sides respectively enabling ingress and egress of airflow through the plurality of electronics racks; and
an air-cooling apparatus facilitating cooling of the airflow passing through the plurality of electronics racks, the air-cooling apparatus comprising:
an air-cooling wall configured for data-center-level cooling and positioned to cool airflow passing through the plurality of electronics racks, the air-cooling wall being disposed separate and free-standing from and in spaced relation to one of the air outlet side or the air inlet side of the plurality of electronics racks, wherein the air-cooling wall is sized and configured with a width spanning the plurality of electronics racks positioned side-by-side in the row, and comprises:
a wall panel support structure independent and separate from the plurality of electronics racks, the wall panel support structure comprising a first track and a second track supporting multiple slidable wall panels free-standing from the at least one electronics rack, wherein the first track and the second track support different slidable wall panels of the multiple slidable wall panels, and are disposed adjacent to each other at the one of the air outlet side or the air inlet side of the plurality of electronics racks positioned side-by-side in the row;
the multiple slidable wall panels comprising at least one air-to-liquid heat exchanger slidably supported by one of the first track of the wall panel support structure or the second track of the wall panel support structure, the multiple slidable wall panels being disposed in spaced relation to the one of the air outlet side or the air inlet side of the plurality of electronics racks to facilitate airflow passing through the plurality of electronics racks also passing across the at least one air-to-liquid heat exchanger, the at least one air-to-liquid heat exchanger extracting heat from air passing thereacross, and the first track of the wall panel support structure being disposed closer to the one of the air outlet side or the air inlet side of the plurality of electronics racks than the second track of the wall panel support structure; and
wherein the one or more slidable wall panels slidably supported by the first track or the second track are configured to be slidably moved to overlap one or more other slidable wall panels slidably supported by the second track or the first track, respectively, while still allowing continued cooling of the airflow passing through the plurality of electronics racks by the at least one air-to-liquid heat exchanger.

15. The data center of claim 14, wherein the multiple slidable wall panels comprise multiple air-to-liquid heat exchangers slidably supported by the wall panel support structure and disposed in opposing relation to the one of the air outlet side or the air inlet side of the plurality of electronics racks, the multiple air-to-liquid heat exchangers being slidable within the wall panel support structure in a direction transverse to a direction of airflow through the plurality of electronics racks and being at least partially offset in the direction transverse to the direction of the airflow through the plurality of electronics racks.

16. The data center of claim 15, wherein at least one slidable wall panel comprising at least one air-to-liquid heat exchanger of the multiple air-to-liquid heat exchangers is sized and configured to span multiple electronics racks of the plurality of electronics racks.

17. The data center of claim 16, wherein the air-cooling wall is disposed in opposing relation to the air outlet side of the plurality of electronics racks, and wherein the air-cooling apparatus further comprises return ducting structures for directing airflow passing across the multiple air-to-liquid heat exchangers to one of an air-conditioning unit of the data center or the air inlet side of the plurality of electronics racks.

18. The data center of claim 16, further comprising ducting structures facilitating defining a common airflow plenum between the one of the air outlet side or the air inlet side of the plurality of electronics racks and the multiple air-to-liquid heat exchangers of the air-cooling wall.

19. The data center of claim 18, wherein the air-cooling wall is disposed in opposing relation to the air outlet side of the plurality of electronics racks, and wherein the air-cooling apparatus further comprises return ducting structures for directing airflow passing across the multiple air-to-liquid heat exchangers to the air inlet side of the plurality of electronics racks.

20. A method comprising:
providing an air-cooling wall configured for data-center-level cooling and facilitating cooling of airflow passing through a plurality of electronics racks positioned side-by-side in a row of the data center, the plurality of electronics racks comprising an air inlet side and an air outlet side, the air inlet and air outlet sides respectively enabling ingress and egress of air through the plurality of electronics racks, and the air-cooling wall being air-permeable and facilitating cooling of airflow passing through the plurality of electronics racks, the air-cooling wall being disposed separate and free-standing from the plurality of electronics racks and in spaced relation to one of the air outlet side or air inlet side of the plurality of electronics racks, wherein the air-cooling wall is sized and configured with a width spanning the plurality of electronics racks, and comprises:

a wall panel support structure independent and separate from the electronics racks, the wall panel support structure comprising a first track and a second track supporting multiple slidable wall panels free-standing from the plurality of electronics racks, wherein the first track and the second track support different slidable wall panels of the multiple slidable wall panels, and are disposed adjacent to each other at the one of the air outlet side or the air inlet side of the plurality of electronics racks positioned side-by-side in the row;

the multiple slidable wall panels comprising at least one air-to-liquid heat exchanger slidably supported by one of the first track of the wall panel support structure or the second track of the wall panel support structure, the multiple slidable wall panels being disposed in spaced relation to the one of the air outlet sides or the air inlet sides of the plurality of electronics racks to facilitate airflow passing through the plurality of electronics racks also passing across the at least one air-to-liquid heat exchanger, the at least one air-to-liquid heat exchanger extracting heat from air passing thereacross, and the first track of the wall panel support structure being disposed closer to the one of the air outlet side or the air inlet side of the plurality of electronics racks than the second track of the wall panel support structure; and wherein one or more slidable wall panels slidably supported by the first track or the second track are configured to be slidably moved to overlap one or more other slidable wall panels slidably supported by the second track or the first track, respectively, while still allowing continued cooling of the airflow passing through the plurality of electronics racks by the at least one air-to-liquid heat exchanger.

* * * * *